United States Patent
Ayranci et al.

(10) Patent No.: US 11,251,765 B2
(45) Date of Patent: *Feb. 15, 2022

(54) ADAPTIVE TUNING NETWORKS WITH DIRECT MAPPED MULTIPLE CHANNEL FILTER TUNING

(71) Applicant: pSemi Corporation, San Diego, CA (US)

(72) Inventors: Emre Ayranci, Costa Mesa, CA (US); Miles Sanner, San Diego, CA (US); Ke Li, San Diego, CA (US); James Francis McElwee, Austin, TX (US); Tero Tapio Ranta, San Diego, CA (US); Kevin Roberts, Rohnert Park, CA (US); Chih-Chieh Cheng, Poway, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/852,275

(22) Filed: Apr. 17, 2020

(65) Prior Publication Data

US 2020/0321935 A1 Oct. 8, 2020

Related U.S. Application Data

(63) Continuation of application No. 16/029,364, filed on Jul. 6, 2018, now Pat. No. 10,700,658, which is a
(Continued)

(51) Int. Cl.
*H04B 1/04* (2006.01)
*H04B 1/40* (2015.01)
(Continued)

(52) U.S. Cl.
CPC .......... *H03H 7/0161* (2013.01); *H04B 1/006* (2013.01); *H04B 1/0053* (2013.01);
(Continued)

(58) Field of Classification Search
CPC ........ H04B 1/0057; H04B 1/006; H04B 1/56; H04B 1/00; H03H 7/0115; H03H 7/0153;
(Continued)

(56) References Cited

U.S. PATENT DOCUMENTS 6,249,687 B1 6/2001 Thomsen et al.
7,339,445 B2 3/2008 Aigner et al.
(Continued)

FOREIGN PATENT DOCUMENTS

CN 1756076 4/2006
CN 201733281 2/2011
(Continued)

OTHER PUBLICATIONS

Tran, Pablo N., Office Action received from the USPTO dated Sep. 17, 2019 for U.S. Appl. No. 16/029,364, 6 pgs.
(Continued)

*Primary Examiner* — Pablo N Tran
(74) *Attorney, Agent, or Firm* — Jaquez Land Greenhaus & McFarland LLP

(57) ABSTRACT

A flexible multi-path RF adaptive tuning network switch architecture that counteracts impedance mismatch conditions arising from various combinations of coupled RF band filters, particularly in a Carrier Aggregation-based (CA) radio system. In one version, a digitally-controlled tunable matching network is coupled to a multi-path RF switch in order to provide adaptive impedance matching for various combinations of RF band filters. Optionally, some or all RF band filters include an associated digitally-controlled filter pre-match network to further improve impedance matching.
(Continued)

In a second version, some or all RF band filters coupled to a multi-path RF switch include a digitally-controlled phase matching network to provide necessary per-band impedance matching. Optionally, a digitally-controlled tunable matching network may be included on the common port of the multi-path RF switch to provide additional impedance matching capability. In a third version, CA direct mapped adaptive tuning networks include filter tuning blocks for selected lower frequency bands.

9 Claims, 24 Drawing Sheets

Related U.S. Application Data continuation-in-part of application No. 15/048,764, filed on Feb. 19, 2016, now Pat. No. 10,141,958.

(51) Int. Cl.

| | | |
|---|---|---|
| *H01B 1/00* | (2006.01) | |
| *H04W 88/06* | (2009.01) | |
| *H03H 7/38* | (2006.01) | |
| *H03H 7/01* | (2006.01) | |
| *H04B 1/00* | (2006.01) | |
| *H04W 72/04* | (2009.01) | |
| *H04W 28/06* | (2009.01) | |
| *H04L 5/00* | (2006.01) | |

(52) U.S. Cl.
CPC ...... *H04B 1/0067* (2013.01); *H04W 72/0453* (2013.01); *H03H 7/38* (2013.01); *H03H 2210/033* (2013.01); *H03H 2210/036* (2013.01); *H04L 5/001* (2013.01); *H04W 28/065* (2013.01)

(58) Field of Classification Search
CPC .......... H03H 7/1758; H03H 7/01; H03H 7/38; H03F 1/56
See application file for complete search history.

(56) References Cited

U.S. PATENT DOCUMENTS

| | | | |
|---|---|---|---|
| 7,729,724 | B2 | 6/2010 | Rofougaran et al. |
| 8,193,877 | B2 | 6/2012 | Fritz et al. |
| 9,024,700 | B2 | 5/2015 | Ranta |
| 9,118,376 | B2 | 8/2015 | Khlat et al. |
| 9,197,194 | B2 | 11/2015 | Reedy et al. |
| 9,240,811 | B2 | 1/2016 | Norholm |
| 9,667,215 | B2 | 5/2017 | Uejima |
| 9,712,196 | B2* | 7/2017 | Ripley ................. H03H 7/1758 |
| 9,712,197 | B2 | 7/2017 | Ripley et al. |
| 9,893,794 | B2* | 2/2018 | Wloczysiak ......... H04B 7/0805 |
| 9,998,153 | B2* | 6/2018 | Balm ................... H04B 1/0053 |
| 10,108,825 | B2 | 10/2018 | Bienert |
| 10,141,958 | B2 | 11/2018 | Ranta et al. |
| 10,200,077 | B2* | 2/2019 | Liu ...................... H04B 1/0057 |
| 10,277,259 | B2* | 4/2019 | Ella ........................ H03H 7/465 |
| 10,700,658 | B2 | 6/2020 | Ayranci et al. |
| 10,840,887 | B2* | 11/2020 | Schmalzl ................. H04B 1/50 |
| 10,979,021 | B2* | 4/2021 | Pfann ....................... H03H 7/12 |
| 2010/0052813 | A1 | 3/2010 | Okabe |
| 2012/0238224 | A1 | 9/2012 | Iwai et al. |
| 2012/0274417 | A1 | 11/2012 | Kihara et al. |
| 2012/0300679 | A1 | 11/2012 | Tsutsumi |
| 2013/0043946 | A1 | 2/2013 | Hadjichristos et al. |
| 2013/0063223 | A1 | 3/2013 | See et al. |
| 2013/0122831 | A1 | 5/2013 | Desclos et al. |
| 2013/0241666 | A1 | 9/2013 | Granger-Jones et al. |
| 2013/0250819 | A1 | 9/2013 | Khlat et al. |
| 2013/0273860 | A1 | 10/2013 | Pehlke |
| 2014/0073268 | A1 | 3/2014 | Taniuchi et al. |
| 2014/0112213 | A1 | 4/2014 | Norholm et al. |
| 2015/0055428 | A1 | 2/2015 | Henry et al. |
| 2015/0295596 | A1 | 10/2015 | Wloczysiak et al. |
| 2015/0318890 | A1 | 11/2015 | Uejima |
| 2017/0094662 | A1 | 3/2017 | Ebihara |
| 2017/0244432 | A1 | 8/2017 | Ranta et al. |
| 2017/0346516 | A1 | 11/2017 | Ripley et al. |
| 2019/0013790 | A1 | 1/2019 | Ayranci et al. |
| 2021/0006273 | A1* | 1/2021 | Tahara ................. H04B 1/0057 |

FOREIGN PATENT DOCUMENTS

| | | |
|---|---|---|
| CN | 102684712 | 9/2012 |
| CN | 10373352 | 4/2014 |
| CN | 103733522 | 4/2014 |
| CN | 103797708 | 5/2014 |
| CN | 104104395 | 10/2014 |
| CN | 104919713 | 9/2015 |
| CN | 105099493 | 11/2015 |
| CO | 104919713 | 9/2015 |
| WO | 2017142625 | 8/2017 |

OTHER PUBLICATIONS

Tran, Pablo N., Notice of Allowance received from the USPTO dated Feb. 21, 2020 for U.S. Appl. No. 16/029,364, 26 pgs.
Tran, Pablo N., Office Action received from the USPTO dated Jun. 6, 2017 for U.S. Appl. No. 15/048,764, 6 pgs.
Tran, Pablo N., Office Action received from the USPTO dated Jul. 19, 2017 for U.S. Appl. No. 15/048,764, 19 pgs.
Tran, Pablo N., Final Office Action received from the USPTO dated Sep. 29, 2017 for U.S. Appl. No. 15/048,764, 11 pgs.
Tran, Pablo N., Advisory Action received from the USPTO dated Nov. 9, 2017 for U.S. Appl. No. 15/048,764, 3 pgs.
Tran, Pablo N., Office Action received from the USPTO dated Dec. 14, 2017 for U.S. Appl. No. 15/048,764, 11 pgs.
Tran, Pablo N., Final Office Action received from the USPTO dated Apr. 18, 2018 for U.S. Appl. No. 15/048,764, 12 pgs.
Tran, Pablo N., Advisory Action received from the USPTO dated Jun. 29, 2018 for U.S. Appl. No. 15/048,764, 3 pgs.
Tran, Pablo N., Notice of Allowance received from the USPTO dated Sep. 14, 2018 for U.S. Appl. No. 15/048,764, 11 pgs.
Ranta, et al., Response filed in the USPTO dated Jul. 6, 2017 for U.S. Appl. No. 15/048,764, 7 pgs.
Ranta, et al., Response filed in the USPTO dated Aug. 14, 2017 for U.S. Appl. No. 15/048,764, 9 pgs.
Ranta, et al., Response filed in the USPTO dated Oct. 25, 2017 for U.S. Appl. No. 15/048,764, 9 pgs.
Ranta, et al., Response filed in the USPTO dated Mar. 14, 2018 for U.S. Appl. No. 15/048,764, 8 pgs.
Ranta, et al., Response filed in the USPTO dated Jun. 18, 2018 for U.S. Appl. No. 15/048,764, 11 pgs.
Patrice, Nathalie, Invitation to Pay Additional Fees received from the EPO dated Apr. 10, 2017 for appln. No. US/PCT2016/069030, 7 pgs.
Lindberg, Per, International Search Report and Written Opinion received from the EPO dated Jul. 14, 2017 for appln. No. PCT/US2016/069030, 15 pgs.
Peregrine Semiconductor Corporation, Demand and Amendment filed in the EPO dated Dec. 11, 2017 for appln. No. PCT/US2016/069030, 16 pgs.
Lindberg, Per, Written Opinion received from the EPO dated Jan. 22, 2018 for appln. No. PCT/US2016/069030, 6 pgs.
Meister, Pia, International Preliminary Report on Patentability received from the EPO dated Apr. 30, 2018 for appln. No. PCT/US2016/069030, 16 pgs.
Liao, Xiaoli, Office Action and English translation received from the CNIPA dated Oct. 21, 2019 for appln. No. 201680077332.7, 14 pgs.
pSemi Corporation, Preliminary Amendment filed in the USPTO dated Sep. 27, 2018 for U.S. Appl. No. 16/029,364, 7 pgs.
pSemi Corporation, Preliminary Amendment filed in the USPTO dated Oct. 30, 2018 for U.S. Appl. No. 16/029,364, 3 pgs.

(56) References Cited

OTHER PUBLICATIONS pSemi Corporation, Response filed in the USPTO dated Nov. 18, 2019 for U.S. Appl. No. 16/029,364, 7 pgs.
Tang, et al., English translation of Office Action received from the CNIPA dated May 31, 2021 for appln. No. 202010300280.3, 10 pgs.

* cited by examiner

+ = B3
o = B3 + B1
x = B3 + B1 + B7

1.810 GHz to 1.880 GHz in .01 GHz steps

Tunable Matching Network

Tunable Matching Network

Reconfigurable Tunable Matching Network

Reconfigurable Tunable Matching Network

Phase Match Network

*1300*

*1400*

2200

Freq (1.8000GHz to 2.700GHz)

2202

Freq (1.8000GHz to 2.700GHz)

*2700*

```
┌─────────────────────────────────────┐
│ Providing a multi-path switch       │
│ having a plurality of signal ports  │
│ and a common port, the multi-path   │──── 2702
│ switch configured to concurrently   │
│ connect at least two selected       │
│ signal ports to the common port in  │
│ at least one CA mode of operation   │
└─────────────────────────────────────┘
                  │
                  ▼
┌─────────────────────────────────────┐
│ Providing a plurality of band       │
│ filters, each corresponding to an   │──── 2704
│ associated RF frequency band in a   │
│ range of low frequencies to high    │
│ frequencies                         │
└─────────────────────────────────────┘
                  │
                  ▼
┌─────────────────────────────────────┐
│ Coupling at least one filter tuning │
│ block between an associated signal  │
│ port of the multi-path switch and   │
│ at last one associated band filter, │
│ each filter tuning block configured │
│ to adjust the RF characteristics of │──── 2706
│ its associated band filter with     │
│ respect to at least one other band  │
│ filter when operating in at least   │
│ one CA mode of operation so as to   │
│ suppress a capacitive loading       │
│ effect for at least one other band  │
│ filter                              │
└─────────────────────────────────────┘
                  │
                  ▼
┌─────────────────────────────────────┐
│ Wherein fewer than all of the       │
│ plurality of band filters are       │──── 2708
│ coupled to an associated filter     │
│ tuning block                        │
└─────────────────────────────────────┘
```

```
Providing a multi-path switch having a plurality of
signal ports and a common port, the multi-path
switch configured to concurrently connect at least      — 2802
two selected signal ports to the common port in at
least one CA mode of operation
```

```
Providing a first set of band filters for a first range
of RF frequencies, and coupling each member of          — 2804
the set being to a respective signal port of the
multi-path switch
```

```
Providing a second set of band filters for a second
range of RF frequencies, and coupling each
member of the set coupled to a respective signal        — 2806
port of the multi-path switch through an associated
filter tuning block
```

```
Using the filter tuning blocks to adjust the RF
characteristics of the associated band filter with
respect to at least one band filter in the first set of
band filters when operating in at least one CA          — 2808
mode of operation, so as to suppress a capacitive
loading effect for at least one band filter in the
second set of band filters
```

FIG. 28

ADAPTIVE TUNING NETWORKS WITH DIRECT MAPPED MULTIPLE CHANNEL FILTER TUNING

CROSS-REFERENCE TO RELATED APPLICATIONS

This application is a continuation of, and claims priority to, commonly owned U.S. patent application Ser. No. 16/029,364, filed Jul. 6, 2018, entitled "Adaptive Tuning Networks with Direct Mapped Multiple Channel Filter Tuning", the contents of which are hereby incorporated in their entirety. application Ser. No. 16/029,364 is a continuation-in-part of, and claims priority to, commonly owned U.S. patent application Ser. No. 15/048,764, filed Feb. 19, 2016, entitled "Adaptive Tuning Network for Combinable Filters", now U.S. Pat. No. 10,141,958, issued Nov. 27, 2018, the contents of which are hereby incorporated in their entirety.

BACKGROUND

(1) Technical Field

This invention relates to electronic circuits, and more particularly to radio frequency electronic circuits and related methods.

(2) Background

A simple radio system generally operates in one radio frequency (RF) band for transmitting RF signals and a separate RF band for receiving RF signals. Although an RF band commonly may be referred to by a single frequency number, an RF band typically spans a range of frequencies (e.g., 10 to 100 MHz per band), and actual signal transmission and reception may be in sub-bands of such bands, spaced apart to avoid interference. Alternatively, two widely spaced RF bands may be used for signal transmission and reception, respectively.

More advanced radio systems, such as some cellular telephone systems, may be operable over multiple RF bands for signal transmission and reception, but at any one time still use only one transmit sub-band and one receive sub-band within a single RF band, or only two widely spaced transmit and receive RF bands. Such multi-band operation allows a single radio system to be interoperable with different international frequency allocations and signal coding systems (e.g., CDMA, GSM). For some applications, international standards bodies have labeled common frequency bands with band labels, Bn, such as B1, B3, B7, etc. One listing of such bands may be found at https://en.wikipedia.org/wiki/UMTS_frequency_bands. Note that the band labels are not assigned in strict frequency order.

In recent years, a technique called "Carrier Aggregation" (CA) has been developed to increase bandwidth for RF radio systems, and in particularly cellular telephone systems. In one version of CA known as "inter-band" mode, cellular reception or transmission may occur over multiple RF bands simultaneously (e.g., RF bands B1, B3, and B7). This mode requires passing the receive or transmit RF signal through multiple band filters simultaneously, depending on the required band combination.

FIG. 1A is a block diagram of a prior art RF signal switching and filter circuit 100 that may be used in a CA radio system. In the illustrated example, an antenna 101 is coupled to a multi-path switch 102 that is further coupled to several RF band filters 104. The multi-path switch 102 can selectively couple the antenna 101 to the RF band filters 104 one at a time or in selected combinations. The multi-path switch 102 would typically be implemented using field-effect transistors (FETs), in known fashion. Some or all of the RF filters 104 would be coupled to other RF circuitry, such as a receiver, a transmitter, or a transceiver (not shown). In the illustrated example, band filters 104 for three frequency bands B1, B3, B7 are shown. In operation, the component RF band filters 104 (e.g., for RF bands B1, B3, B7) may be switched into circuit by the multi-path switch 102 individually in a non-CA mode, or in combinations in a CA mode.

For optimum performance, each of the band filters 104 and their desired combinations (e.g., B3 alone, B1+B3 concurrently, and B1+B3+B7 concurrently) must be impedance matched to the switch 102 and antenna 101, typically at a characteristic impedance of 50 ohms for modern radio circuits. FIG. 1B is a Smith chart 110 showing the range of unmatched impedance values of several example combinations of three modeled filters for the configuration shown in FIG. 1A. In the illustrated example, looking at the B3 frequencies only swept over a frequency range of 1.810 GHz to 1.880 GHz in 10 MHz steps, the plot points (for B3 alone, plus the effects of adding B1 or B1+B7 to B3) show that, ideally, different amounts of impedance matching would be required to match a characteristic impedance of 50 ohms not only for each combination, but also for each frequency step. Accordingly, because of the impedance mismatch, the RF signal switching and filter circuit 100 is not a practical solution for a CA radio system.

If the number of combinations of bands Bn is small and the bands are far enough apart, the band filters 104 may be combined into a single feed point (i.e., no switch 102 is necessary) using passive combining techniques, such as "diplexing" or "triplexing" circuits, which use carefully tuned fixed matching networks to combine multiple filters together and approximately match impedances. For example, FIG. 2A is a block diagram of a prior art RF triplexer filter circuit 200. A bank of filters 104 is connected to an antenna 101 through various fixed combinations of inductors Ln and capacitors Cn that are designed to match the impedance of a respective filter 104 to the impedance of the antenna 101 for a specific band of frequencies (e.g., B1, B3, B7). A diplexer circuit works on the same principles. All of the fixed matching circuit elements must be designed to complement each other. However, such an architecture prevents free selection of band combinations with existing filters.

To resolve this issue with a small number of frequency bands, it is possible to passively combine (e.g., using diplexers or triplexers, such as in FIG. 2A) separate groups of band filters, and then selectively activate one corresponding passively-combined impedance matching circuit at a time using a single-pole, multi-throw (SPnT) switch (e.g., SPST). For example, FIG. 2B is a block diagram of a prior art RF multiplexed triplexer-connected filter circuit 210. A 5-way multipath switch 102 can select any one set of triplexer-combined band filters 212a-212e for connection to the antenna 101. Since only one throw of the multipath switch 102 is ON at a time, no additional tuning is required. However, this approach is still not flexible and must be custom designed for every combination of frequency bands. In addition, the amount of circuitry required for all of the band filters 212a-212e is quite large, owing to the redundant number of band filters required. For example, band filter set 212a and band filter set 212b both require band filters (e.g., surface acoustic wave filters) for bands B1 and B3. Further-more, it is essentially not practical to use passive combining for a large number of frequency bands Bn because of the large number of possible combinations of such bands and of overlapping or adjacent frequency ranges.

Accordingly, there is a need for an ability to flexibly enable multiple frequency bands in an RF signal switching and filter circuit that may be used in a CA radio system, without degrading system performance. The present invention addresses this need.

SUMMARY OF THE INVENTION

The invention encompasses a flexible multi-path RF adaptive tuning network switch architecture that counteracts impedance mismatch conditions arising from various combinations of coupled RF band filters.

In a first RF switch architecture, a digitally-controlled tunable matching network is coupled to a multi-path RF switch in order to provide adaptive impedance matching for various combinations of RF band filters. Optionally, some or all RF band filters also include an associated digitally-controlled filter pre-match network to further improve impedance matching. In a preferred embodiment, the tunable matching network and any optional filter pre-match networks are integrated with a multi-path RF switch on an integrated circuit (IC).

In a second RF switch architecture, some or all RF band filters coupled to a multi-path RF switch include a digitally-controlled phase matching network to provide necessary per-band impedance matching. Optionally, a digitally-controlled tunable matching network may also be included on the common port of the multi-path RF switch to provide additional impedance matching capability. In a preferred embodiment, the phase matching networks and any optional tunable matching network are integrated with a multi-path RF switch within an IC.

In a third RF switch architecture, CA direct mapped adaptive tuning networks include filter tuning blocks for specific bands (instead of all bands), depending on particular performance requirements and filter characteristics. Benefits of CA direct mapped adaptive tuning networks with filter tuning blocks on selected lower frequency bands include: improved overall non-CA performance; improved high band performance in CA cases; reduced component count and less circuit complexity; and a more versatile control scheme that is better suited for adaptive tuning optimization.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 27 is a process flow diagram of a first method of adaptively tuning a CA multi-path RF switch architecture.

FIG. 28 is a process flow diagram of a second method of adaptively tuning a CA multi-path RF switch architecture.

Like reference numbers and designations in the various drawings indicate like elements unless the context requires otherwise.

DETAILED DESCRIPTION OF THE INVENTION

Figure 1A:
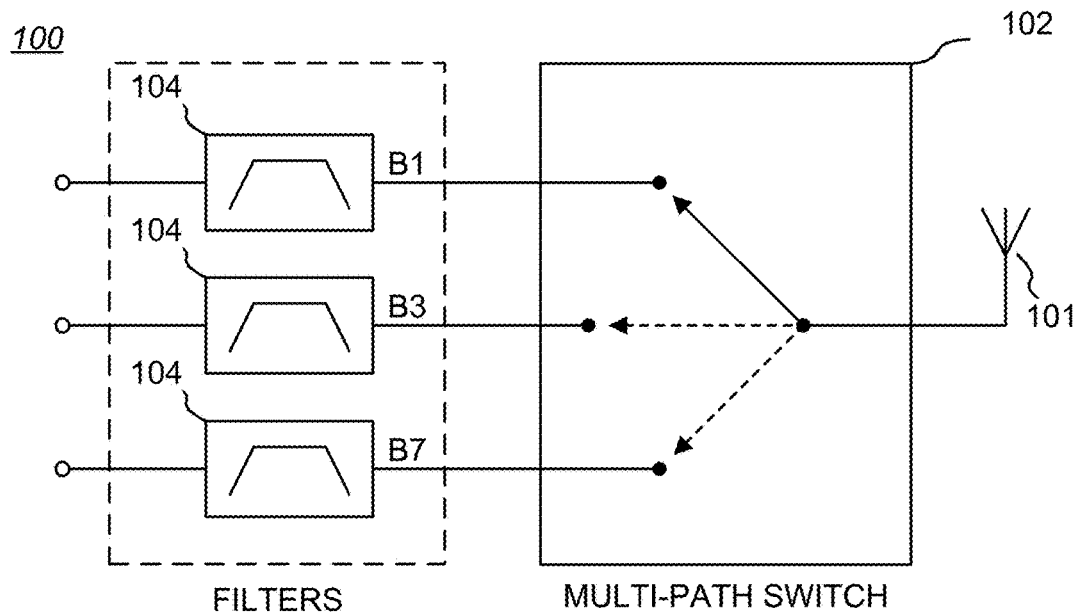
FIG. 1A is a block diagram of a prior art RF signal switching and filter circuit that may be used in a CA radio system.
Figure 1B:
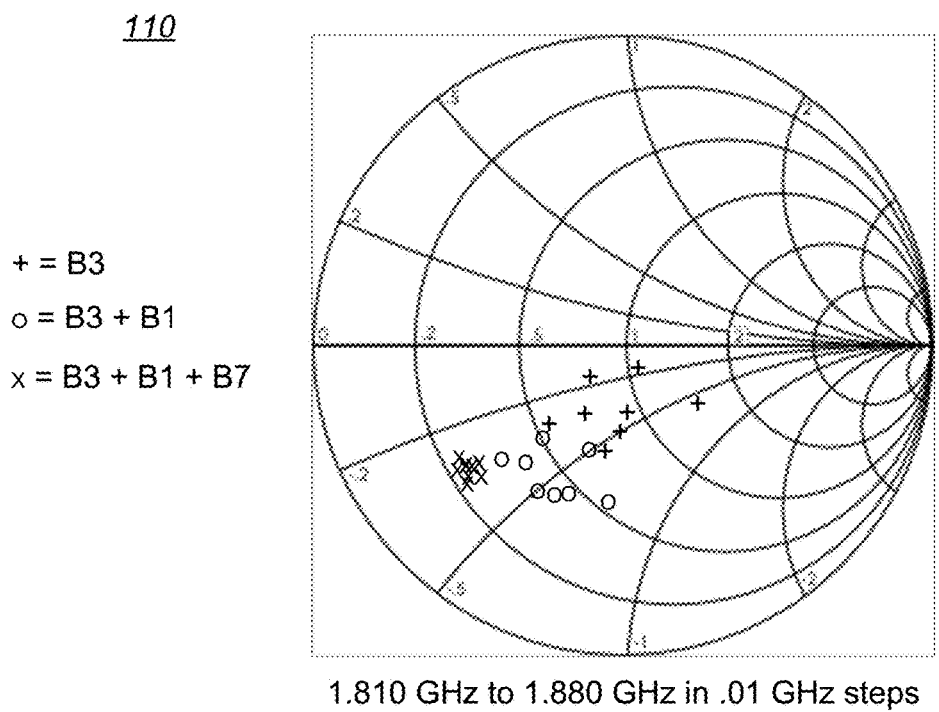
FIG. 1B is a Smith chart showing the range of unmatched impedance values of several example combinations of three modeled filters for the configuration shown in FIG. 1A.

The invention encompasses a flexible multi-path RF adaptive tuning network switch architecture that counteracts impedance mismatch conditions arising from various combinations of coupled RF band filters.

In a first RF switch architecture, a digitally-controlled tunable matching network is coupled to a multi-path RF switch in order to provide adaptive impedance matching for various combinations of RF band filters. Optionally, some or all RF band filters also include an associated digitally-controlled filter pre-match network to further improve impedance matching. In a preferred embodiment, the tunable matching network and any optional filter pre-match networks are integrated with a multi-path RF switch on an integrated circuit (IC).

In a second RF switch architecture, some or all RF band filters coupled to a multi-path RF switch include a digitally-controlled phase matching network to provide necessary per-band impedance matching. Optionally, a digitally-controlled tunable matching network may also be included on the common port of the multi-path RF switch to provide additional impedance matching capability. In a preferred embodiment, the phase matching networks and any optional tunable matching network are integrated with a multi-path RF switch within an IC.

In a third RF switch architecture, CA direct mapped adaptive tuning networks include filter tuning blocks for specific bands (instead of all bands), depending on particular performance requirements and filter characteristics. Benefits of CA direct mapped adaptive tuning networks with filter tuning blocks on selected lower frequency bands include: improved overall non-CA performance; improved high band performance in CA cases; reduced component count and less circuit complexity; and a more versatile control scheme that is better suited for adaptive tuning optimization.

Tunable Matching Network Architecture

Connecting a set of RF band filters to a digitally controlled multi-path RF switch allows any combination of switch throws (and hence signal switch paths) to be activated by direct mapping of control words to switch states. However, using a conventional design, activating multiple switch paths at the same time would result in a large impedance mismatch, high insertion loss, and worsened return loss as each activated RF band filter loads each other activated RF band filter. For example, when 3 adjacent RF band filters each having a 50 ohm impedance are activated at the same time, the overall impedance would drop to about 17 ohms, causing several dB of additional insertion loss (IL), and the filter response would be skewed. Such a mismatch could be reduced by adding some fixed amount of phase shift or pre-matching elements to every RF band filter path to alleviate impedance mismatch when combined, but this approach would require a custom design for every filter combination.

A more flexible architecture combines a tunable matching network (TMN) with a multi-path RF switch to adaptively counteract impedance mismatch conditions arising from various combinations of coupled RF band filters. This approach may be combined with a digitally-controlled filter pre-match network to further improve impedance matching.

Figure 3:
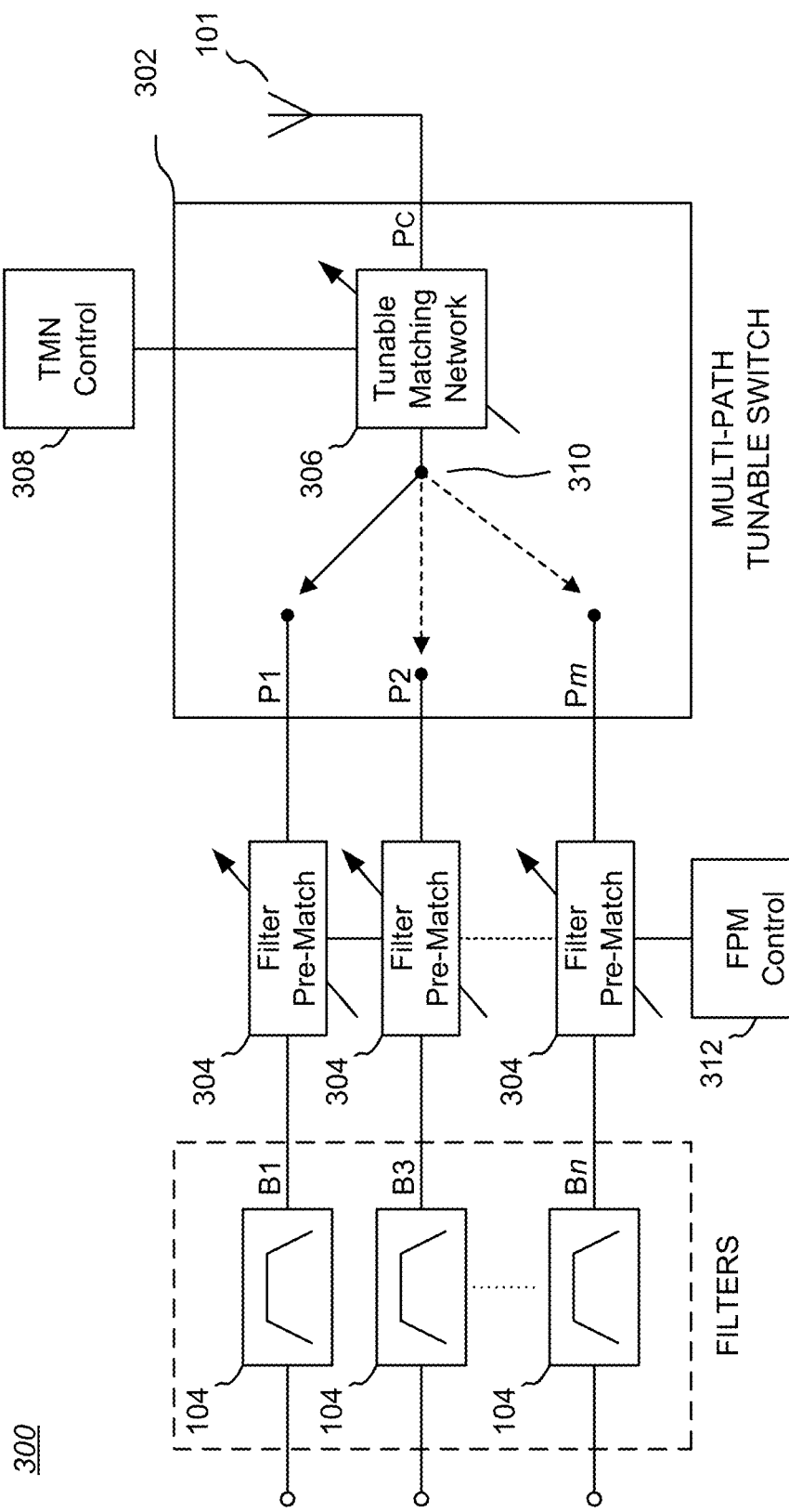
FIG. 3 is a block diagram of one embodiment of an RF signal switching and filter circuit that includes a multi-path tunable switch and, optionally, a bank of filter pre-match networks, suitable for use in a CA radio system as well as in other applications.

FIG. 3 is a block diagram of one embodiment of an RF signal switching and filter circuit 300 that includes a multi-path tunable switch 302 and, optionally, a bank of filter pre-match networks 304, suitable for use in a CA radio system as well as in other applications. The illustrated multi-path tunable switch 302 includes a digitally controlled TMN 306 that may be coupled to a TMN Control circuit 308 that converts a binary control word (externally supplied or internally generated) into switch control lines. The TMN 306 is coupled to a multi-path RF switch element 310, which typically would be implemented using field-effect transistors (FETs) in known fashion. A common port $P_c$ of the multi-path tunable switch 302 may be coupled to an RF signal element, such as an antenna 101. Some number of a set of M signal ports P1-Pm may be coupled to a plurality of corresponding RF elements, particularly to a set of RF band filters 104 that can be selectively coupled to the antenna 101 one at a time or in combinations (in the illustrated embodiment, the RF band filters 104 are each shown with an associated band label, Bn, which may or may not correspond to a port designation Pm). In one embodiment, M=10, and thus up to 10 ports may be selectively placed in circuit with the common port $P_c$ alone or in parallel combinations (e.g., B1 alone, B1+B3 concurrently, and B1+B3+Bn concurrently).

The RF band filters 104 are preferably bandpass filters having a very sharp (in terms of the transition from passband to reject band) passband, which would typically would be implemented using surface acoustic wave (SAW), bulk acoustic wave (BAW), or similar filter technologies having sharp passbands. Also shown coupled between each RF band filter 104 and a corresponding port of the multi-path tunable switch 302 are digitally-controlled filter pre-match networks 304, discussed in greater detail below.

In operation, the component RF band filters 104 (e.g., for frequency bands B1, B3, . . . Bn) may be switched into circuit by the multi-path tunable switch 302 individually in a non-CA mode, or in combinations in a CA mode. For each RF band filter 104 combination, the TMN Control circuit 308 would set the TMN 306 to a calibrated state to provide proper impedance matching for the selected combination. TABLE 1 below shows an example of a 3-bit control word that defines 8 states that are mapped, by way of example, to specific active bands that correspond to some emerging industry operational modes.

TABLE 1

| State | Binary State | Active Bands | CA Mode |
| --- | --- | --- | --- |
| 0 | 0 0 0 | none | none |
| 1 | 0 0 1 | B3 | Non-CA |
| 2 | 0 1 0 | B1 | Non-CA |
| 3 | 0 1 1 | B3 and B1 | 2 band CA case 1 |
| 4 | 1 0 0 | B7 | Non-CA |
| 5 | 1 0 1 | B7 and B3 | 2 band CA case 3 |
| 6 | 1 1 0 | B7 and B1 | 2 band CA case 2 |
| 7 | 1 1 1 | B7, B3, and B1 | 3 band CA |

While the TMN Control circuit 308 is shown as being external to the multi-path tunable switch 302, it may be fabricated in conjunction with the multi-path tunable switch 302 on the same IC. The TMN Control circuit 308 may be configured to receive control words directly from an external source to set a TMN 306 to a selected impedance tuning state (e.g., based on a band combination selected by a user or external circuitry) by means of a digital interface, or control words may be indirectly supplied from a look-up table (i.e., implemented as fuses, PROM, EEPROM, etc.) containing tuning states for various RF band combinations or from various control signals processed through combinatorial circuitry. Thus, program control of the TMN Control circuit 308 can be based on a user selection or external control signal, or be automatically set in response to detected system states or parameters (e.g., switch state, lookup values, detected signal frequency, signal strength, power consumption, IC device temperature, etc.).

For non-CA operation, the TMN 306 may be programmed to an impedance value that essentially makes the TMN 306 nearly invisible as a load. Alternatively, the TMN 306 may include a bypass switch, as described in further detail below, to effectively remove the TMN 306 from the signal path.

Tunable Matching Networks

While the illustrated RF signal switching and filter circuit 300 shows the TMN 306 in a preferred position on the common port $P_c$ of the multi-path tunable switch 302, TMN units may instead be or also be coupled to one or more corresponding signal ports Pm; such "signal port-side" TMN units, while consuming more IC die area, may provide even more precise control of impedance matching. In any case, a TMN 306 may be placed in shunt or series connection with the signal path, and have a combination of shunt and/or series elements.

Each TMN 306 is designed to meet the impedance tuning ratio required to be able to impedance match a selected combination of RF band filters 104 with respect to the load on the common port $P_c$ while minimizing additional insertion loss. Each TMN 306 should have both a broad enough tuning range and a fine enough tuning step size to be able to handle the various desired band filter combinations efficiently.

Figure 4:
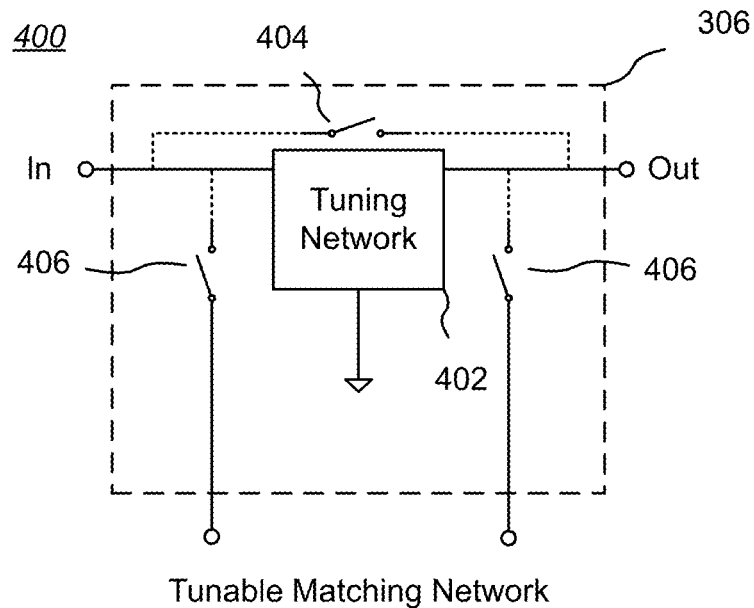
FIG. 4 is a block diagram of a generic architecture for a tunable matching network.

FIG. 4 is a block diagram 400 of a generic architecture for a tunable matching network 306. In the illustrated example, a tuning network 402 is coupled along a signal path defined by IN and OUT ports (in this case, the circuit is symmetrical and hence the port labels are arbitrary and reversible). An optional bypass switch 404 allows the tuning network 402 to be switched out of circuit when no impedance matching is desired, such as may occur in a non-CA mode. Optional switchable connections 406 allow connection to other tuning elements (e.g., external inductors or tuning networks) or load elements (e.g., an antenna).

The tuning network 402 is shown as a generic three-port device, and may be series connected between the IN and OUT ports, or configured internally to be shunt connected between the signal path and circuit ground, or configured internally as a combination of series and shunt connections—for example, selectable between a series connection or a shunt connection, or having a more complex dynamically reconfigurable topology (see further discussion below).

In greater detail, a TMN 306 may consist of one or more digitally tunable or switchable capacitors (DTCs), and/or digitally tunable or switchable inductors (DTLs), and/or digitally tunable or selectable transmission line elements (TLEs), such as microstrip or co-planar waveguides or lumped transmission line circuits. Several TMNs 306 may be used for more complicated cases. Examples of DTCs are shown in U.S. Pat. No. 9,024,700, issued on May 5, 2015, entitled "Method and Apparatus for use in Digitally Tuning a Capacitor in an Integrated Circuit Device", and examples of DTLs are shown in U.S. patent application Ser. No. 13/595,893, filed on Aug. 27, 2012, entitled "Method and Apparatus for Use in Tuning Reactance in an Integrated Circuit Device", both of which are assigned to the assignee of the present invention and both of which are hereby incorporated by reference.

Figure 5:
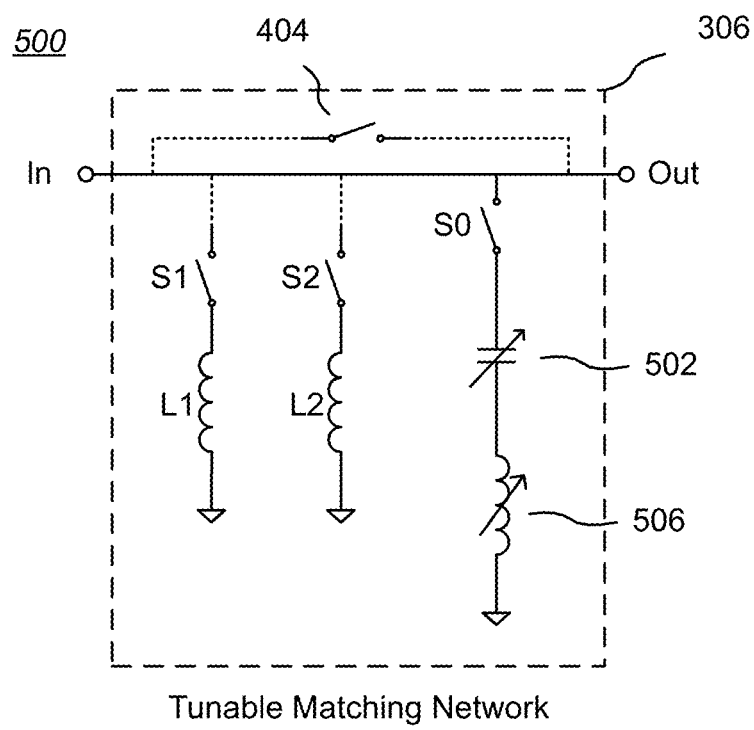
FIG. 5 is a schematic diagram of a first embodiment of a tunable matching network.

A number of useful TMN 306 designs may be used in conjunction with various embodiments of the invention. As one example, FIG. 5 is a schematic diagram 500 of a first embodiment of a tunable matching network 306. The principal adjustable impedance tuning elements are a digitally adjustable capacitor element 502 (e.g., a DTC) and a digitally adjustable inductor element 504 (e.g., a DTL) coupled in series together, and shunt connected between the IN-OUT signal path and circuit ground. In one alternative embodiment, the adjustable inductor element 504 may be replaced by a fixed inductor, and thus only the capacitor element 502 provides adjustability. In another alternative embodiment, the adjustable capacitor element 502 may be replaced by a fixed capacitor, and thus only the inductor element 504 provides adjustability. In either case, the digitally adjustable capacitor and/or inductor elements 502, 504 may be internal or external to an IC. However, in a preferred embodiment, most or all of the components of the TMN 306 are integrated on the same IC as the multi-path tunable switch 302.

Also shown in FIG. 5 are a switch S0 (e.g., a FET) that can disconnect the principal active tuning elements from the IN-OUT signal path, and two optional inductors L1, L2 that may be selectively connected by corresponding switches S1, S2 to the IN-OUT signal path to augment the impedance matching range of the tunable matching network 306. As should be clear, more or fewer than two optional inductors Ln may be included. In the illustrated embodiment, an optional bypass switch 404 is shown, but the optional switchable connections 406 of FIG. 4 are omitted.

Figure 6:
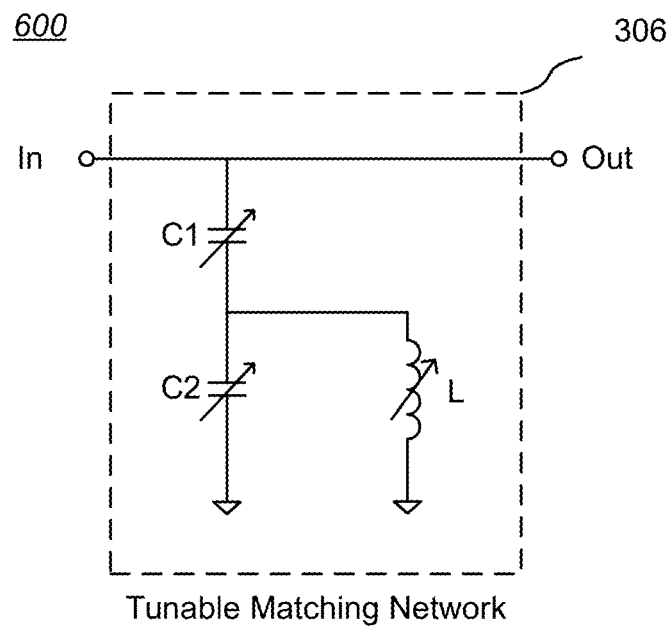
FIG. 6 is a schematic diagram of a second embodiment of a tunable matching network.

FIG. 6 is a schematic diagram 600 of a second embodiment of a tunable matching network 306. The illustrated TMN 306 includes two digitally adjustable capacitor elements C1, C2 coupled in series between the IN-OUT signal path and circuit ground, and a digitally adjustable inductor element L coupled between circuit ground and a node between the two adjustable capacitor elements C1, C2. As in FIG. 5, one or more of the adjustable capacitor and/or inductor elements may be replaced by a fixed element, so long as at least one adjustable impedance tuning element remains. For example, the inductor element L may be fixed and all tuning accomplished using one or both of the adjustable capacitor elements C1, C2. The example circuit illustrated in FIG. 6 is particularly useful because it enables coverage of more points on a Smith chart (not just a curve), thus providing a greater range of impedance matching adjustment than some other embodiments.

Figure 7:
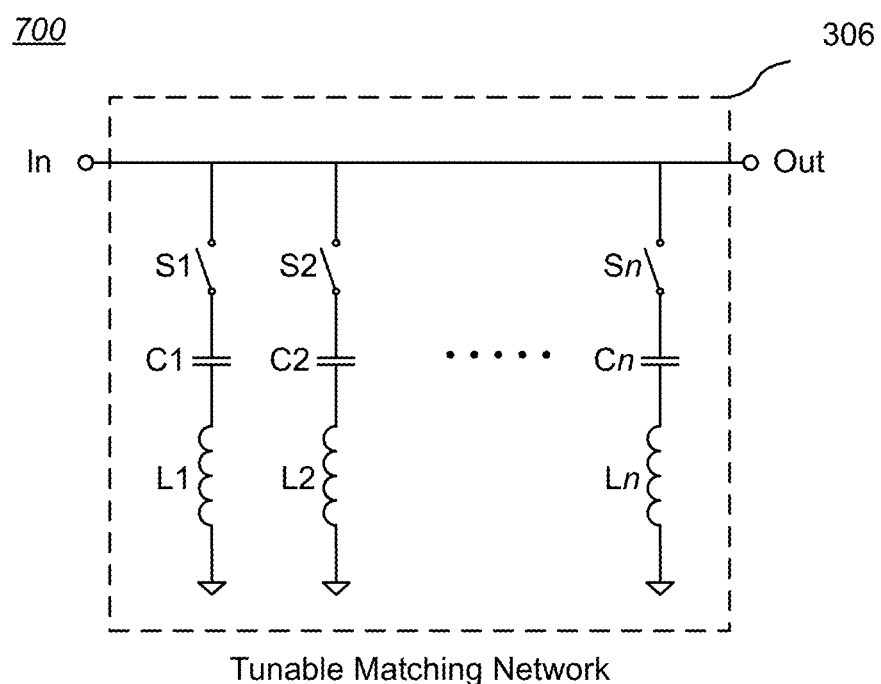
FIG. 7 is a schematic diagram of a third embodiment of a tunable matching network.

FIG. 7 is a schematic diagram 700 of a third embodiment of a tunable matching network 306. In the illustrated embodiment, a set of two or more LC circuits each comprising a fixed capacitor Cn and a fixed inductor Ln may be selectively connected by corresponding switches Sn to the IN-OUT signal path to set a matching impedance value for of the tunable matching network 306. Thus, adjustability is provided by selectively coupling one or more fixed-element LC circuits onto the IN-OUT signal path under the control of a TMN Control circuit 308 (as in FIG. 3) rather than utilizing digitally adjustable impedance tuning elements such as a DTC or DTL. In an alternative embodiment, the LC circuits in FIG. 7 may be replaced by a set of transmission line (TL) elements of varying impedance values that can be selectively coupled to the IN-OUT signal path under the control of the TMN Control circuit 308.

Filter Pre-Match Networks

As noted above with respect to FIG. 3, optionally, some or all RF band filters 104 also include an associated digitally-controlled filter pre-match (FPM) network 304 to further improve impedance matching for the corresponding RF signal path. The FPM networks 304 are preferably configured to be selectively connected to the IN-OUT signal path of an associated RF band filter 104 under the control of an FPM Control circuit 312, as shown in FIG. 3. The FPM Control circuit 312 converts a binary control word (externally supplied or internally generated) into switch control lines.

Figure 8:
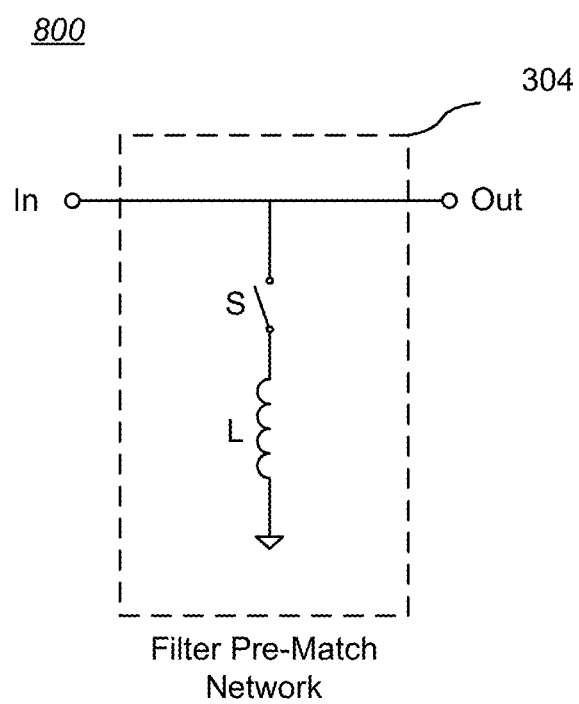
FIG. 8 is a schematic diagram of one embodiment of a digitally-controlled FPM network.

FIG. 8 is a schematic diagram of one embodiment 800 of a digitally-controlled FPM network 304. In the illustrated embodiment, an inductor L having an inductance value suitable to aid impedance matching of an associated RF band filter 104 may be selectively connected to the IN-OUT signal path of the associated RF band filter 104 by a switch S controlled by the FPM Control circuit 312. The switch S enables disconnection of the inductor L when operating in some modes, such as a non-CA mode.

In alternative embodiments, an FPM network 304 may include a digitally adjustable impedance tuning element (e.g., a DTC or DTL) in place of the simple inductor L. In appropriate applications, an FPM network 304 may be essentially any one of the same circuits described above for the TMN 306, or equivalent circuits.

The FPM networks 304 may be integrated within a multi-path tunable switch 302, or may be separate circuit elements interposed between a multi-path tunable switch 302 and corresponding RF band filters 104, or may be integrated with the corresponding RF band filters 104.

Dynamically Reconfigurable Tunable Matching Network Topology

As some of the example embodiments in FIGS. 4-7 illustrate, multiple switchable impedance tuning elements in different configurations provide a flexible solution to achieve reasonably wide coverage of a Smith chart with minimal matching loss while providing a low-loss bypass mode that can be activated when tuning is not required. However, in some applications, it is difficult to achieve a sufficiently wide RF bandwidth without other performance trade-offs when using a fixed-topology tunable matching network (e.g., variable DTCs and/or DTLs, with optional fixed capacitor and inductor elements, but in a fixed topology). Accordingly, a dynamically reconfigurable tunable network topology enables real-time reconfiguration of a tunable matching network (TMN) topology for better optimization of such parameters. A TMN reconfigurable topology uses multiple switchable elements (e.g., a fixed and/or a tunable element in series with a switch) and tunable elements (e.g., one or more variable DTCs or DTLs, generally with an integrated switch-selectable bypass path) to achieve multiple configurations.

Figure 9:
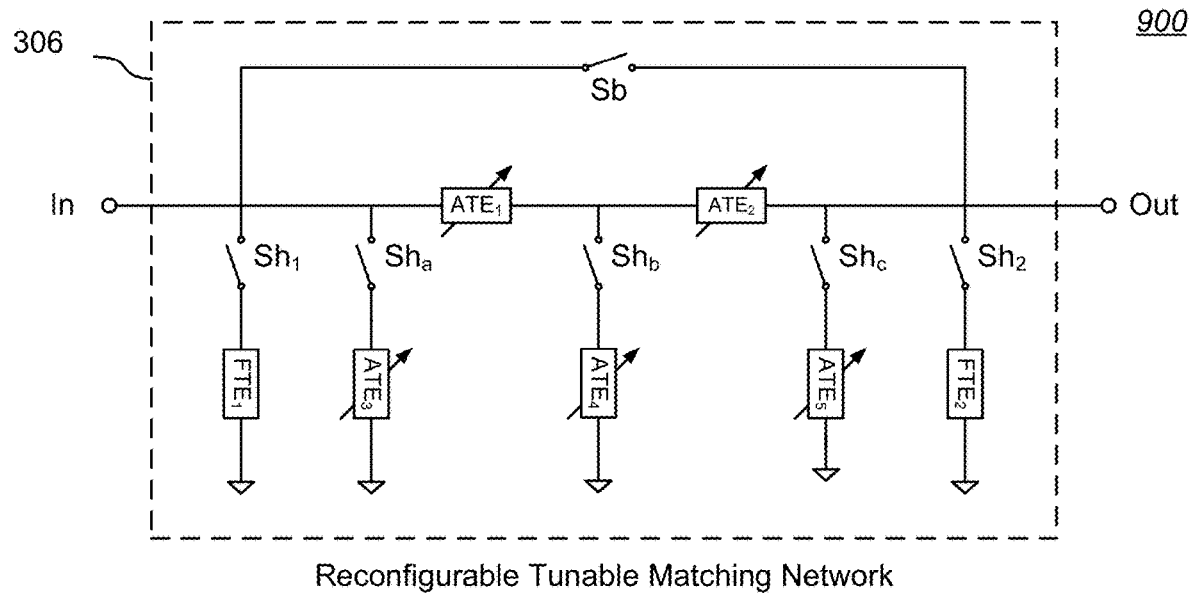
FIG. 9 is a block diagram showing a first embodiment of a dynamically reconfigurable tunable matching network topology.

FIG. 9 is a block diagram showing a first embodiment 900 of a dynamically reconfigurable tunable matching network topology 306. The illustrated example can be programmatically or selectably configured in a pi-type, T-type, or L-pad type topology in which one or more adjustable tuning elements $ATE_1$, $ATE_2$ (e.g., DTCs and/or DTLs) are connectable in series with the IN-OUT signal path of the TMN 306, while three or more adjustable tuning elements $ATE_3$, $ATE_4$, $ATE_5$ are connected as shown in a shunt configuration to circuit ground through corresponding shunt switches $Sh_a$, $Sh_b$, $Sh_c$. Some or all of the adjustable tuning elements may include an integrated switch-selectable bypass switch (not shown) that allows the element to be essentially configured as a short circuit connection. In addition, many other topologies, such as a Bridged-T type, may be configured using the same components or by adding other adjustable tuning elements or other components.

A T-type topology can be configured by coupling $ATE_1$ and $ATE_2$ in series with the IN-OUT signal path and $ATE_4$ in shunt to circuit ground (i.e., switch $Sh_b$ CLOSED), and decoupling $ATE_3$ and $ATE_5$ (i.e., switches $Sh_a$ and $Sh_c$ OPEN). A pi-type topology can be configured in several ways: (1) coupling $ATE_1$ in series with the IN-OUT signal path and $ATE_3$ and $ATE_4$ in shunt to circuit ground, while internally bypassing $ATE_2$ and decoupling $ATE_5$; (2) coupling $ATE_2$ in series with the IN-OUT signal path and $ATE_4$ and $ATE_5$ in shunt to circuit ground, while bypassing $ATE_1$ and decoupling $ATE_3$; and (3) coupling $ATE_1$ and $ATE_2$ in series with the IN-OUT signal path and $ATE_3$ and $ATE_5$ in shunt to circuit ground, while decoupling $ATE_4$. An L-pad type topology can be configured in several ways from any of the pi-type configurations by decoupling one of the two shunt ATEs.

FIG. 9 also shows a bypass switch Sb that allows the entire reconfigurable tunable matching network 306 to be bypassed, and further illustrates that one or more optional fixed tuning elements $FTE_1$, $FTE_2$ (e.g., an internal or external inductor, capacitor, or transmission line element) can be coupled from circuit ground to the IN-OUT signal path of the TMN 306 through associated shunt switches $Sh_1$, $Sh_2$.

It should be apparent that some of the elements shown in FIG. 9 can be omitted for particular applications. For example, if only L-pad type and pi-type topologies are needed, the elements required for a T-type topology can be omitted.

Figure 10:
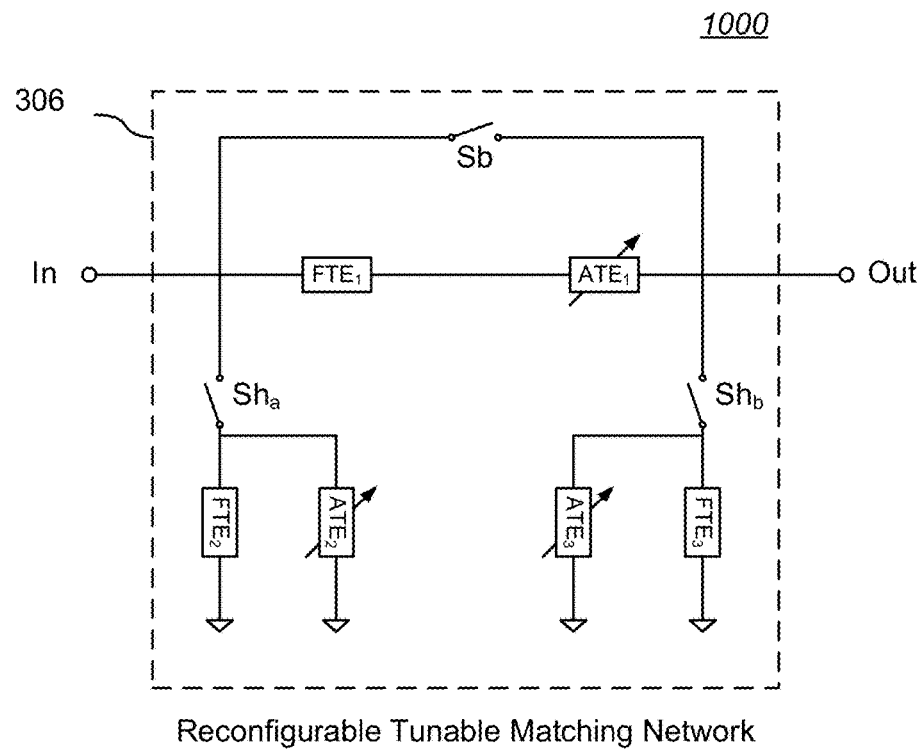
FIG. 10 is a block diagram showing a second embodiment of a dynamically reconfigurable tunable matching network topology.

FIG. 10 is a block diagram showing a second embodiment 1000 of a dynamically reconfigurable tunable matching network topology 306. In the illustrated example, an adjustable tuning element $ATE_1$ and a fixed tuning element $FTE_1$ are connectable in series with the IN-OUT signal path of the TMN 306. Two subcircuits each comprising an adjustable tuning element $ATE_2$, $ATE_3$ in parallel with a corresponding fixed tuning element $FTE_1$, $FTE_2$ to circuit ground are connectable by corresponding shunt switches $Sh_a$, $Sh_b$ to the IN-OUT signal path. The illustrated embodiment can be configured as a pi-type topology by setting both shunt switches $Sh_a$, $Sh_b$ to CLOSED, and as an L-pad type topology by setting one of the two shunt switches $Sh_a$, $Sh_b$ to CLOSED and the other shunt switch of the pair to OPEN. A bypass switch Sb allows the entire reconfigurable tunable matching network 306 to be bypassed.

The topology and/or the tuning element values of the reconfigurable tunable matching networks 306 of FIG. 9 and FIG. 10 may be programmatically set in real-time under the control of the TMN Control circuit 308 of FIG. 3, or set to a particularly configuration at the time of manufacture (e.g., by "blowing" fusible links or by applying an appropriately configured metallization mask when fabricating an IC). In addition, numerous other tunable matching network embodiments can be used in conjunction with the disclosed RF signal switching and filter circuits so long as such networks provide for a suitable range of adjustability.

Phase Matching Network Architecture

As noted above, in a second RF switch architecture, some or all RF band filters coupled to a multi-path RF switch include a digitally-controlled phase matching network to provide necessary per-band impedance matching.

Figure 11:
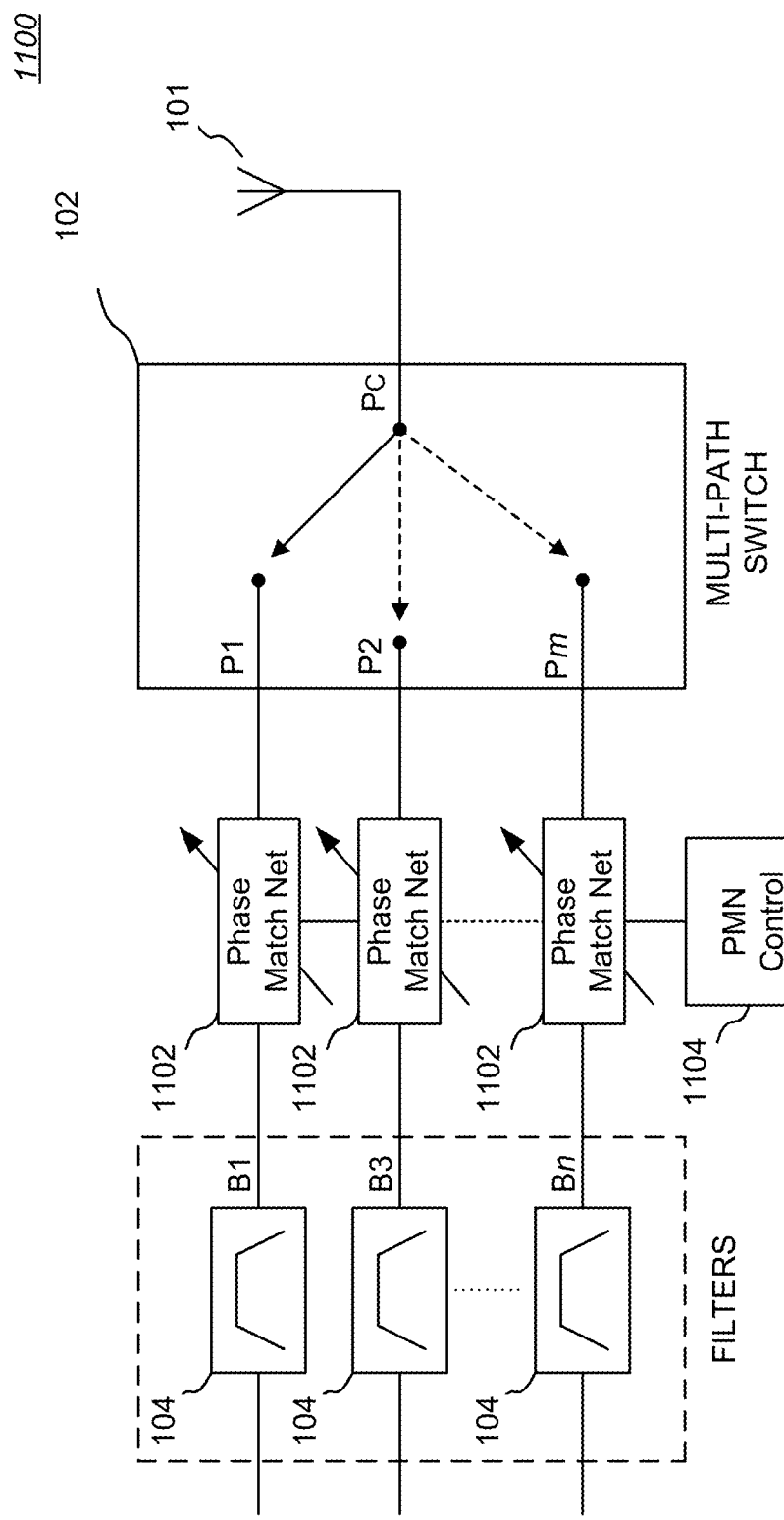
FIG. 11 is a block diagram of one embodiment of an RF signal switching and filter circuit that includes a multi-path switch coupled to a set of two or more RF band filters through a bank of corresponding phase matching networks.

FIG. 11 is a block diagram of one embodiment of an RF signal switching and filter circuit 1100 that includes a multi-path switch 102 (which may include a TMN on the common port, as in FIG. 3) coupled to a set of two or more RF band filters 104 through a bank of corresponding phase matching networks 1102. The phase matching (PM) networks 1102 are coupled to a PMN Control circuit 1104 that converts a binary control word (externally supplied or internally generated) into switch control lines. A common port $P_c$ of the multi-path switch 102 may be coupled to an RF signal element, such as an antenna 101. As in the embodiment shown in FIG. 3, the RF band filters 104 are preferably bandpass filters having a very sharp passband, and typically would be implemented using surface acoustic wave (SAW), bulk acoustic wave (BAW), or similar filter technologies having sharp passbands.

Figure 12:
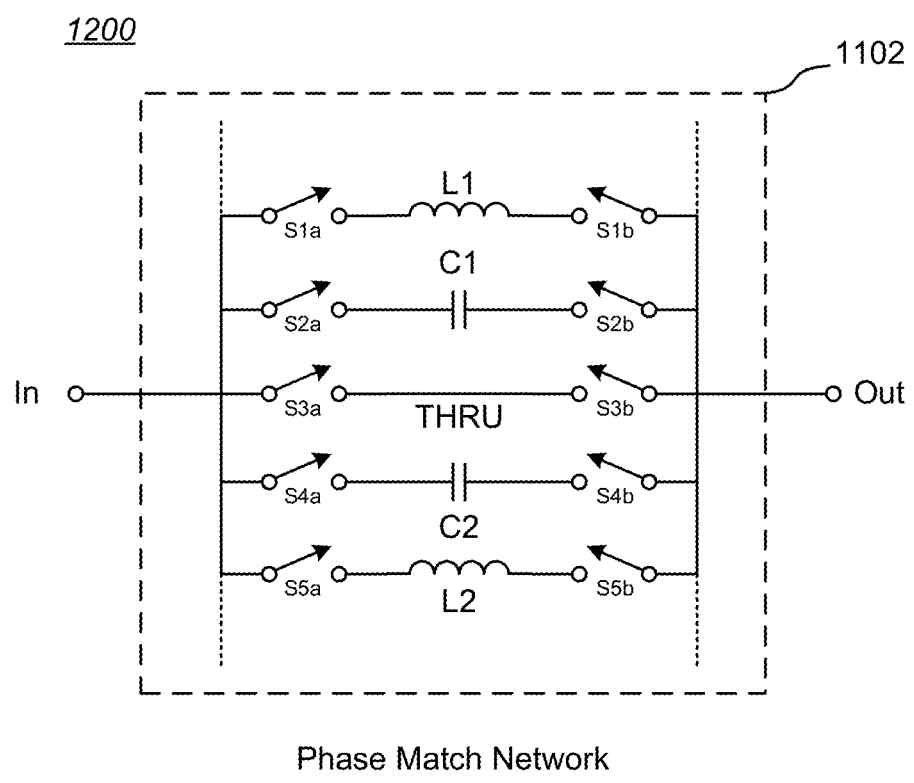
FIG. 12 is a schematic diagram of one embodiment of a phase matching network suitable for use in the circuit shown in FIG. 11.

Embodiments of the invention may include PM networks that include phase shifter circuits having two or more signal paths, such as multi-state phase shifters of the type taught in U.S. patent application Ser. No. 15/017,433, filed on Feb. 5, 2016, entitled "Low Loss Multi-State Phase Shifter", and assigned to the assignee of the present invention, which is hereby incorporated by reference. For example, FIG. 12 is a schematic diagram of one embodiment 1200 of a multi-state phase matching (PM) network 1102 suitable for use in the circuit shown in FIG. 11. In the illustrated example, the PM network 1102 has IN and OUT ports connected by a plurality of n parallel circuit paths each comprising a pair of switches Sna and Snb and an associated phase shift element. Simple phase shift elements may comprise an inductor Ln, a capacitor Cn, a transmission line (not shown) or a THRU conductor (e.g., a simple wire or IC trace or similar conductor) series connected between the switch pairs Sna-Snb. More complex phase shift elements may also be used, such as a lumped transmission line comprising one or more CLC units (i.e., shunt C-series L-shunt C circuits). The phase shift elements may be physically located on the same integrated circuit (IC) die as the switch pairs Sna-Snb, or an IC may be configured with conductive pads to enable connection of external phase shift elements to the switch pairs Sna-Snb. The order of the phase shift elements is not critical, but a designer may wish to take care to minimize component interactions.

The switch pairs Sna-Snb in each of the parallel circuit paths provide input/output symmetry and are concurrently switched within a parallel circuit path to allow the associated phase shift element to be placed in-circuit between the IN and OUT ports under the control of an applied signal from the PMN Control circuit 1104. The switches Sn are typically implemented as FETs, particularly as MOSFETs. Each of the switches Sn is in a single-pole, single-throw (SPST) configuration, and thus can be implemented with a single FET device (although in order to withstand applied signal voltages in excess of the capabilities of a single FET, stacks of FET switches may be controlled by a common control line signal so as to switch ON or OFF concurrently, and thus behave like a single high-voltage SPST switch). Further, the switch pairs Sna-Snb may be independently controlled, so that two or more parallel circuit paths may be switched into circuit between the IN and OUT ports at the same time.

The illustrated PM network 1102 shows five parallel circuit paths, as set forth in TABLE 2. While five parallel circuit paths are shown, other embodiments may have more than five parallel circuit paths (as suggested by the dotted lines in FIG. 12). However, the PM network 1102 may have as few as three parallel circuit paths (e.g., circuit paths 1, 2 and 3 in TABLE 2) or even as few as two parallel circuit paths (e.g., if the THRU path is omitted in some embodiments, or if only a THRU path and one phase shift path is used).

TABLE 2

| Circuit Path | Parallel Circuit Path Components |
| --- | --- |
| 1 | S1a-L1-S1b |
| 2 | S2a-C1-S2b |
| 3 | S3a-THRU-S3b |
| 4 | S4a-C2-S4b |
| 5 | S5a-L2-S5b |

In operation, the component RF band filters 104 (e.g., for frequency bands B1, B3, . . . Bn) may be switched into circuit by the multi-path switch 102 individually in a non-CA mode, or in combinations in a CA mode. The PMN Control circuit 1104 will select a particular phase shift setting for each PM network 1102 to impedance match the associated RF band filter 104 with respect to the applied load from the antenna 101 and any other RF band filter 104 switched into circuit.

The phase matching networks 1102 may be configured with other adjustable phase shifting circuits, and optionally may be configured or programmed to provide a fixed phase shift for bands Bn that are only switched into circuit singly (e.g., if band B1 is only ever used by itself and adjustable phase shifting is not needed for other reasons, such as reducing intermodulation distortion). In particular, at least one phase matching network 1102 may be a digitally-controlled tunable matching network (such as the TMN 306 of FIG. 3), including a reconfigurable TMN. Optionally, a digitally-controlled TMN 306 and TMN Control circuit 308 of the type shown in FIG. 3 may also be included on the common port $P_c$ of the multi-path RF switch to provide additional impedance matching capability.

Comparative Simulation Data

Figure 13:
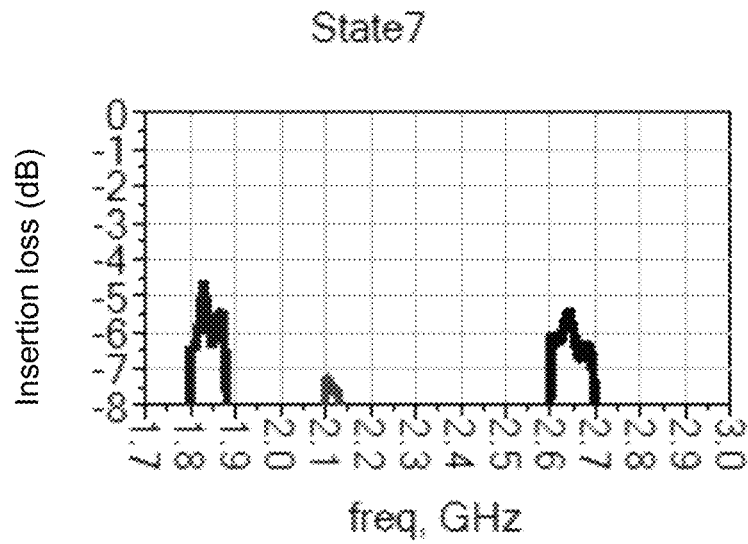
FIG. 13 is a graph of the insertion loss versus frequency of one combination of CA band filters (B1+B3+B7) for a simulation of the prior circuit shown in FIG. 1A for three frequency bands.
Figure 14:
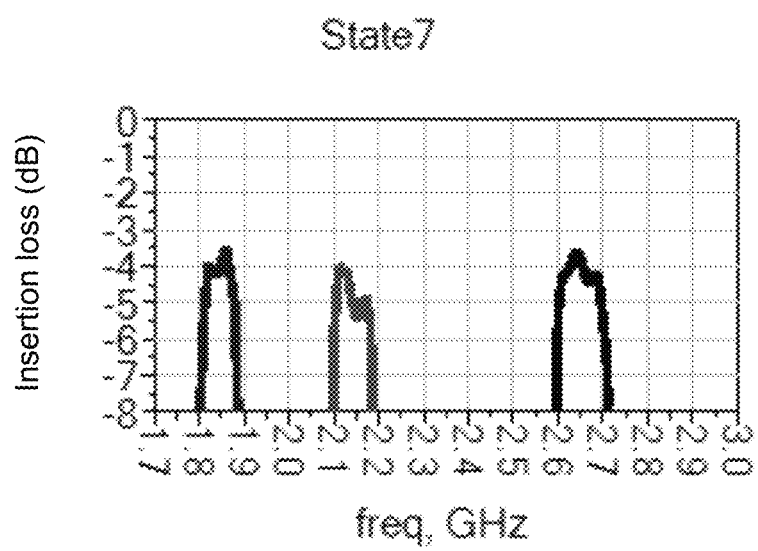
FIG. 14 is a graph of the insertion loss versus frequency for a simulation of the novel circuit shown in FIG. 3 for the same configuration of CA band filters and frequency bands shown in FIG. 13.

FIG. 13 is a graph 1300 of the insertion loss versus frequency of one combination of CA band filters (B1+B3+B7) for a simulation of the prior art circuit shown in FIG. 1A for three frequency bands. FIG. 14 is a graph 1400 of the insertion loss versus frequency for a simulation of the novel circuit shown in FIG. 3 for the same configuration of CA band filters and frequency bands shown in FIG. 13. As the two graphs 1300, 1400 demonstrate, the novel circuit of FIG. 3 shows an improvement in IL of about 1.5 dB at the low band (1.81 GHz to 1.88 GHz), about 3 dB at the mid-band (2.11 GHz to 2.18 GHz), and about 2 dB at the high band (2.61 GHz to 2.69 GHz). A similar comparison (not shown) of the prior art circuit simulation and the simulation of the novel circuit of FIG. 3 for a different combination of CA band filters (B1+B3) showed improvement in IL of more than 1.5 dB at the mid-band. In addition, the simulation of the novel circuit of FIG. 3 exhibited an IL of less than 2 dB (absolute, not comparative) for all non-CA modes.

In terms of RF performance, such improvements are significant, and are enabled by the improved impedance matching provided by the flexible multi-path RF adaptive tuning network switch architecture of the present invention.

Methods

Another aspect of the invention includes a method for adaptively tuning a multi-path radio-frequency (RF) switch, including:

providing a multi-path tunable switch having (1) a plurality of signal ports each configured to be coupled to a corresponding RF band filter and (2) a common port;

configuring the multi-path tunable switch to concurrently connect at least two selected signal ports to the common port in at least one mode of operation;

coupling a digitally-controlled tunable matching network to the common port of the multi-path tunable switch; and selectively controlling the digitally-controlled tunable matching network to counteract impedance mismatch conditions arising from coupling more than one selected RF band filter concurrently to the common port.

Yet another aspect of the invention includes a method for adaptively tuning a multi-path radio-frequency (RF) switch, including:

providing a multi-path tunable switch having a common port and a plurality of signal ports;

configuring the multi-path tunable switch to concurrently connect at least two selected signal ports to the common port in at least one mode of operation;

coupling each of a plurality of digitally-controlled phase matching networks to a corresponding signal port of the multi-path tunable switch;

configuring each digitally-controlled phase matching network to be coupled to a corresponding RF band filter; and selectively controlling each digitally-controlled phase matching network to counteract impedance mismatch conditions arising from coupling more than one selected RF band filter concurrently to the common port.

Additional aspects of the methods described above include integrating the multi-path tunable switch and the digitally-controlled tunable matching network on the same integrated circuit die; coupling at least one filter pre-match network to a corresponding signal port of the multi-path tunable switch and configuring the at least one filter pre-match network to be coupled to a corresponding RF band filter; integrating the multi-path tunable switch and the at least one filter pre-match network on the same integrated circuit die; the digitally-controlled tunable matching network including at least one of a digitally tunable capacitor and/or a digitally tunable inductor; the digitally-controlled tunable matching network being reconfigurable between at least two types of topologies; coupling a signal port-side digitally-controlled tunable matching network to at least one corresponding signal port of the multi-path tunable switch; coupling a plurality of RF band filters to corresponding signal ports of the multi-path tunable switch; integrating the multi-path tunable switch and the plurality of digitally-controlled phase matching networks on the same integrated circuit die; at least one digitally-controlled phase matching network being a digitally-controlled tunable matching network; at least one digitally-controlled phase matching network including at least one of a digitally tunable capacitor and/or a digitally tunable inductor; at least one digitally-controlled phase matching network being reconfigurable between at least two types of topologies; coupling a digitally-controlled tunable matching network to the common port of the multi-path tunable switch; and coupling a plurality of RF band filters to corresponding digitally-controlled phase matching networks.

CA Adaptive Tuning Networks with Direct Mapped Multiple Channel Filter Tuning

Figure 2A:
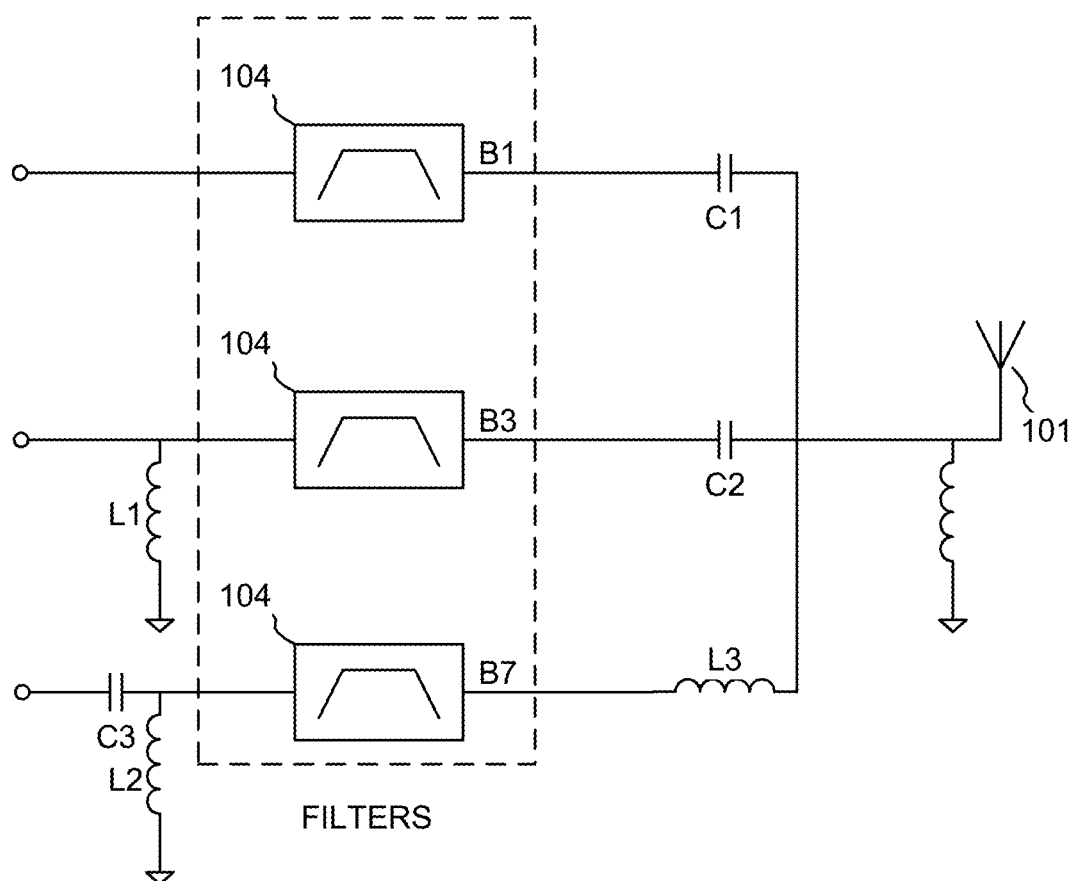
FIG. 2A is a block diagram of a prior art RF triplexer filter circuit.
Figure 2B:
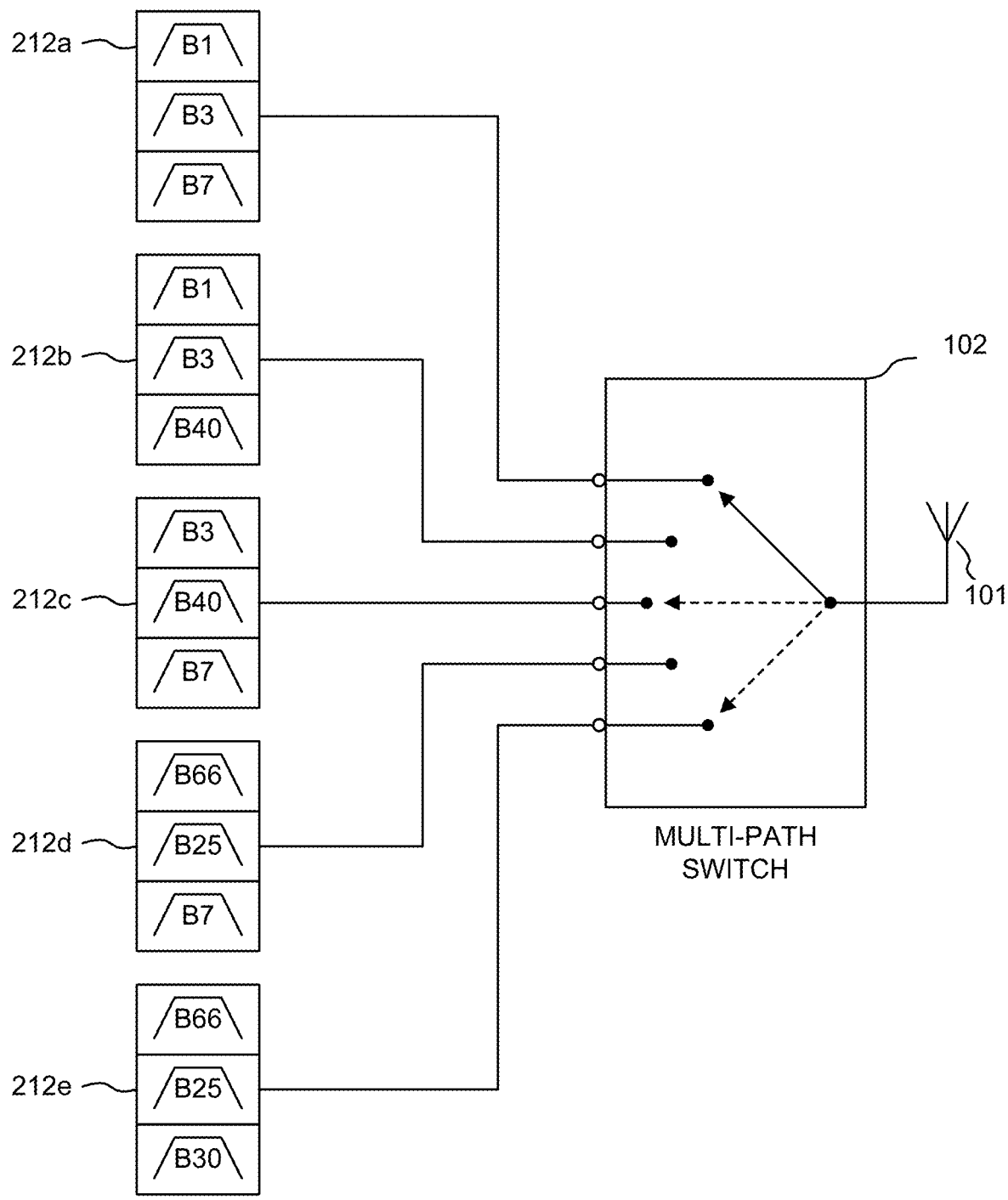
FIG. 2B is a block diagram of a prior art RF multiplexed triplexer-connected filter circuit.

The network architectures described in this Detailed Description of the Invention can be characterized as "direct mapped" configurations, since any and all combinations of individual band filters 104 can be selected ("mapped") by appropriate programming of a multi-path switch for connection to a common port. Compared to a direct mapping configuration, the multiplexed conventional configuration of FIG. 2B, for example, results in a larger component count and greater complexity, and thus higher cost. In addition, direct mapping enables more combinations of band filters for carrier aggregation (CA) than can be readily done with a multiplexer of a reasonable size. Accordingly, because fewer band filters are needed, direct mapping has advantages in reduced component count, cost, and performance. Further, single band filters are easier to design, which generally means a direct mapping configuration exhibits better non-CA performance than a multiplexed configuration.

Figure 15:
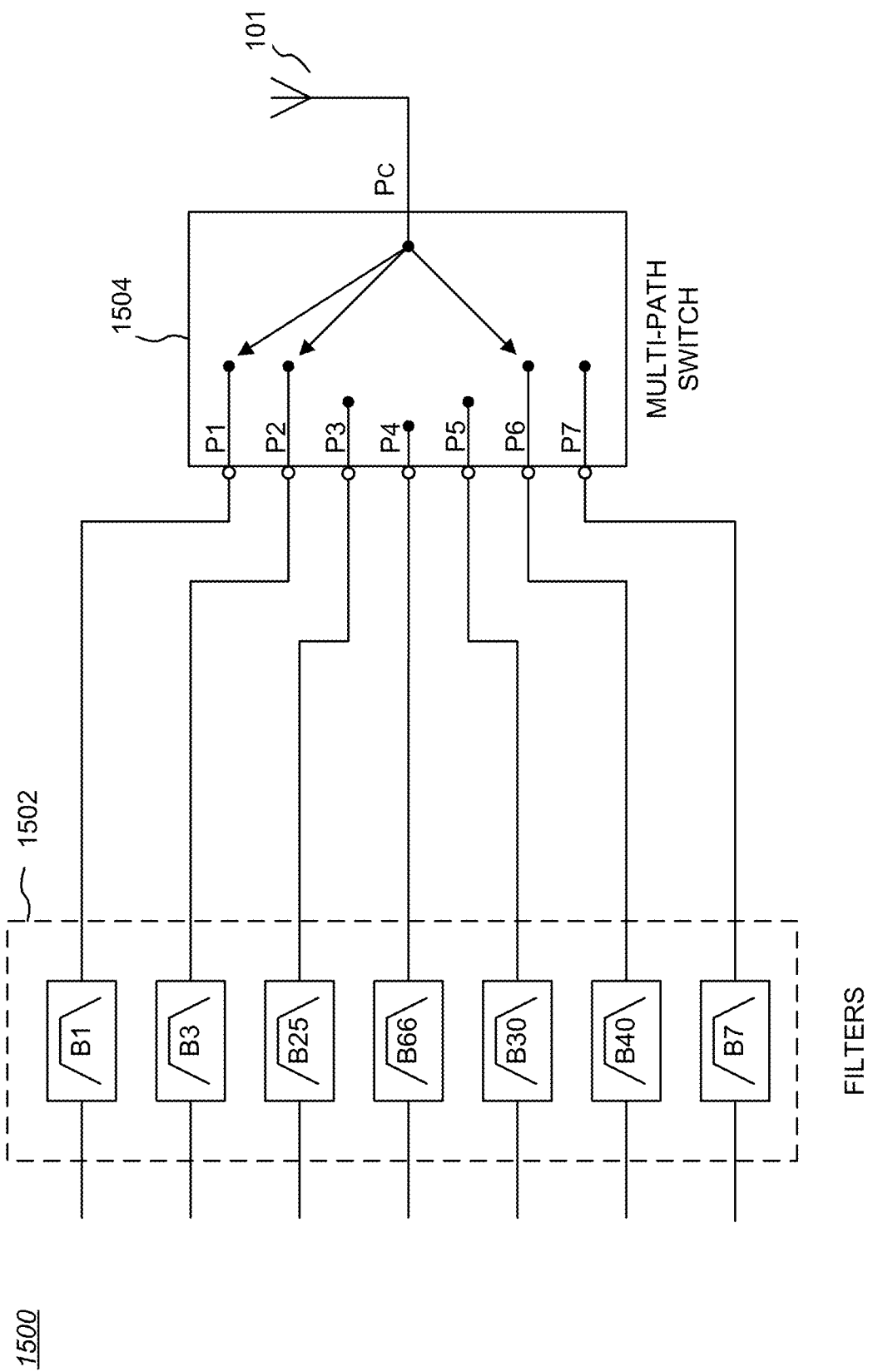
FIG. 15 is a block diagram of a direct mapped RF signal switching and filter circuit that may be used in a CA radio system.

Despite the benefits of direct mapping for CA antenna switch configurations, direct mapping embodiments may present their own challenges. For example, FIG. 15 is a block diagram of a direct mapped RF signal switching and filter circuit 1500 that may be used in a CA radio system. In the illustrated example, a filter bank 1502 includes seven band filters, B1, B3, B7, B25, B30, B40, and B66. The seven band filters are respectively coupled to ports P1-P7 of a multi-path switch 1504. In a CA mode in which band filters B1, B3, and B40 are aggregated, when ports P1, P2, and P6 are coupled to an antenna 101 through the common port Pc of the multi-path switch 1504, the band filters impose a load on each other, the effects of which are frequency dependent and asymmetrical. That is, the band filters operating at a lower frequency (e.g., B3 at 1.8 GHz, B1 at 2.1 GHz) impose more of a load on band filters operating at a higher frequency (e.g., B40 at 2.3 GHz) than vice versa. In particularly, the B1/B3 band filter pair S11 parameter looks very capacitive at band filter B40's frequency and thus loads the B40 band filter, hurting its performance. Combining band filters B1, B3, and B7 (at 2.6 GHz) would exhibit even greater loading on band filter B7.

Figure 16:
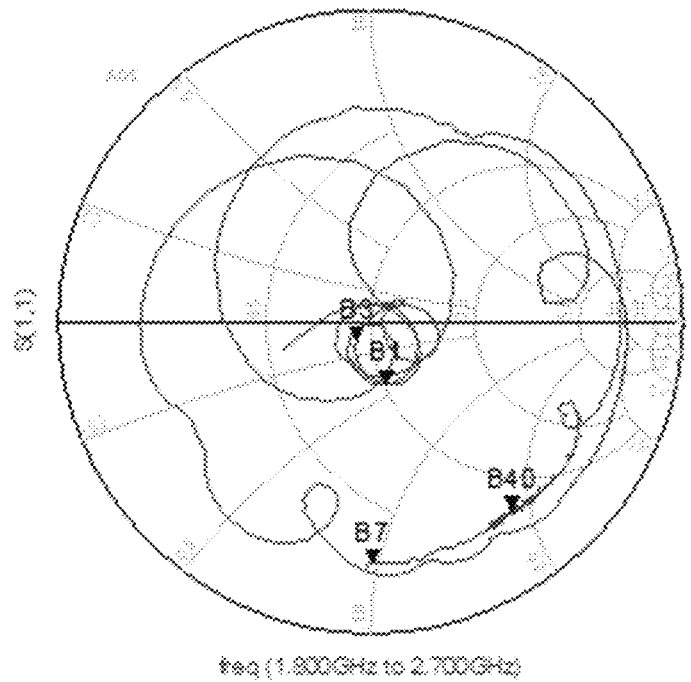
FIG. 16 is a Smith chart 1600 graphing the S11 parameters for diplexed band filters B1 and B3, illustrating the loading effect of the B1/B3 diplexer at the B7 and B40 bands.

As an example, FIG. 16 is a Smith chart 1600 graphing the S11 parameters for diplexed band filters B1 and B3, illustrating the loading effect of the B1/B3 diplexer at the B7 and B40 bands. The loading can worsen when the effects of circuit trace lengths and parasitic effects in an IC embodiment are fully taken into account; for example, the plot point for B40 moves closer to the plot point for B7 with just moderate loading from the effects of circuit trace lengths and parasitic effects in an IC embodiment.

Figure 17:
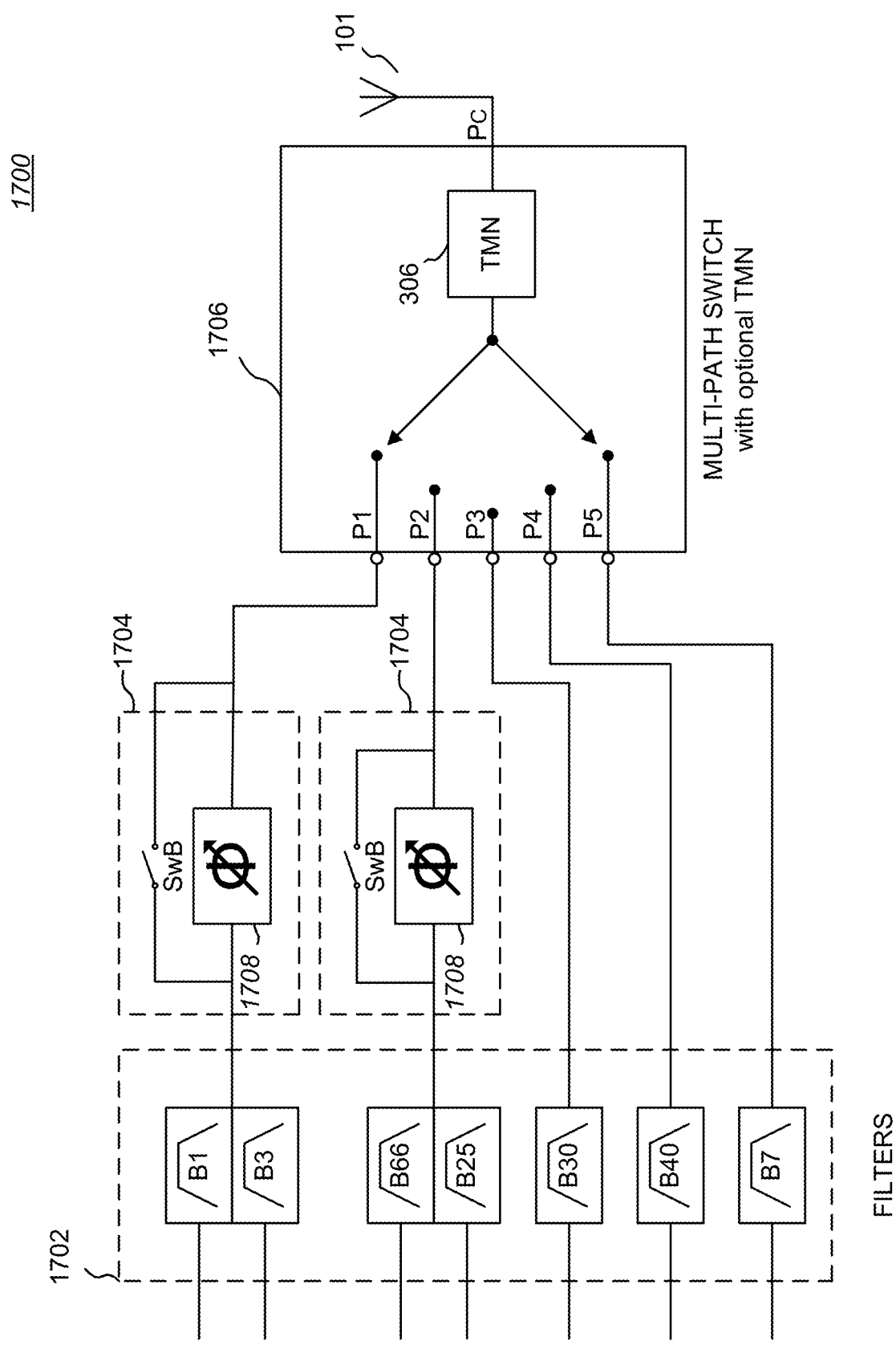
FIG. 17 is a block diagram of a direct mapped RF signal switching and filter circuit that includes a bank of band filters and one or more filter tuning blocks.

One aspect of the invention encompasses embodiments in which a "filter tuning" block is added in series with selected throws (signal paths) of a multi-path switch, which optionally may include a tunable matching network on the common port. For example, FIG. 17 is a block diagram of a direct mapped RF signal switching and filter circuit 1700 that includes a bank 1702 of band filters and one or more filter tuning blocks 1704. Another aspect of the invention is to passively combine selected band filters pairs using conventional diplexing circuitry. This vastly simplifies the design compared to a fully general solution, and typically can lead to a better overall implementation.

In the specific example of FIG. 17, band filters B1 and B3 are in a diplexed configuration (i.e., passively combined) and coupled to port P1 of a multi-path switch 1706 through an associated filter tuning block 1704. Similarly, band filters B25 and B66 are diplexed and coupled to port P2 of the multi-path switch 1706 through an associated filter tuning block 1704. In the illustrated example, the multi-path switch 1706 may include a tunable matching network (TMN) 306 on the common port Pc, similar to the configuration shown in FIG. 3 (as well as in FIG. 23, below). In this specific example, each diplexed pair of band filters (e.g., B1 and B3) operates at a lower frequency and is thus less affected by the filter tuning blocks 1704 or loss due to the passive combination. In general, higher frequency bands are more sensitive to the loading of extra capacitance (such as from a DTC used for tuning in the filter tuning blocks 1704). Using DTCs in the filter tuning blocks 1704 for lower frequency bands will have less impact on the performance of the higher frequency bands when operating individually (e.g., in a non-CA mode). However, the concepts of the invention are not limited to diplexing only lower frequency band filters, but specifically extend to diplexed configurations of higher frequency band filters.

Each diplexed pair of band filters (e.g., B1/B3 or B66/B25) can be combined with any of the single band filters (e.g., B30, B40, B7) by direct mapping. For example, the diplexed B1/B3 band filter pair and the B40 band filter can be connected to the common port Pc through the multi-path switch 1706 by direct mapping; in such a case, the settings of the filter tuning block 1704 associated with B1/B3 would be adjusted as needed.

In the illustrated example, each filter tuning block 1704 includes a filter tuning circuit 1708 in parallel with an optional bypass switch SwB. The optional bypass switch SwB allows the associated filter tuning circuit 1708 to be bypassed when operating in a non-CA mode, to avoid degrading non-CA performance (e.g., with respect to matching insertion loss, linearity, etc.).

In a particular CA mode of operation in which a signal path that includes a filter tuning block 1704 is turned ON, the filter tuning circuit 1708 rotates (i.e., changes the phase of) the out-of-band input impedance of the connected band filters (and passive filter structures, in the case of diplexed band filter pairs) to reduce the load on a higher-frequency band filter included in that CA mode. The result is that the impedance of the higher-frequency band filter is rotated closer to an "open" on a Smith chart (see the discussion below regarding FIG. 19). Thus, for example, in a B1/B3/B40 CA mode, the filter tuning circuit 1708 in the B1/B3 signal path rotates the impedance seen at the B40 band to an "open", thus reducing the loading impact of the B1/B3 band filters on the B40 band filter.

FIGS. 18A-18E are examples of particular circuits that may be used as a filter tuning block 1704 and embodied fully or partially in an integrated circuit. Each of the example circuits includes a filter tuning circuit and a bypass switch SwB that, when closed (alone or in combination with additional series-connected switches), allows the associated filter tuning circuit to be bypassed if desired (e.g., for a non-CA mode). Each of the example circuits also includes at least one shunt inductor L1 and at least one capacitor C1 configured to shift the out-of-band impedance closer to an open circuit in the frequency range of interest. The inductor L1 and/or the capacitor C1 may be tunable; in the illustrated examples, the capacitor C1 is shown as tunable. In particular embodiments, the capacitor C1 may be a digitally tunable or switchable capacitor (DTC), and the inductor L1 may be a digitally tunable or switchable inductor (DTL) and/or a digitally tunable or selectable transmission line element (TLEs), such as a microstrip or co-planar waveguide or a lumped-element transmission line circuit. The inductor L1 and/or the capacitor C1—and particularly the inductor L1—may be internal or external to an IC embodiment of the filter tuning block 1704.

Figure 18A:
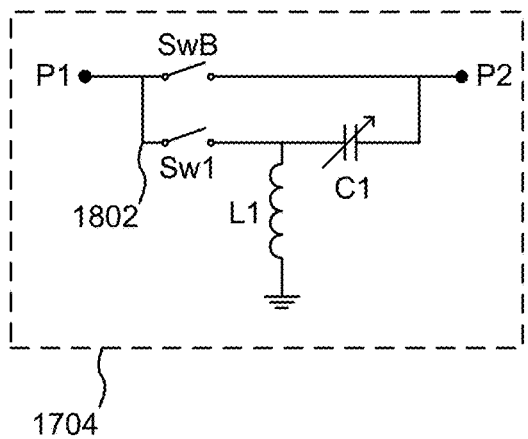
FIGS. 18A-18E are examples of particular circuits that may be used as a filter tuning block and embodied in an integrated circuit.

In FIG. 18A, in an active non-bypass mode, switch Sw1 would be closed to connect a first port P1 to a second port P2 via a signal path 1802 coupled to a series-connected tunable capacitor C1 and a shunt-connected inductor L1, as shown. Advantages of the circuit configuration of FIG. 18A are simplicity and a single series switch in any operational mode.

Figure 18B:
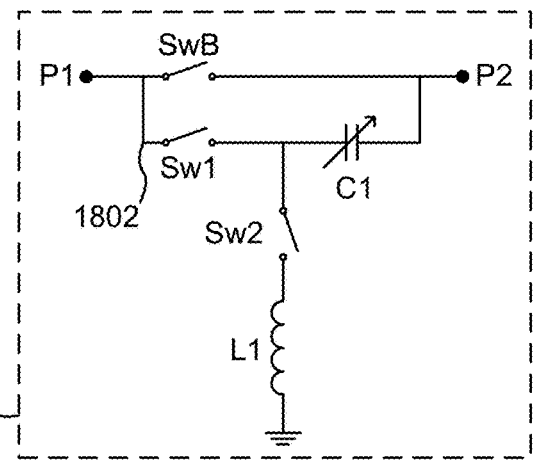

In FIG. 18B, in an active non-bypass mode, switch Sw1 would be closed to connect a signal path 1802 to a series-connected tunable capacitor C1. In addition, switch Sw2 may be closed to couple a shunt-connected inductor L1 to the signal path 1802. The circuit configuration of FIG. 18B thus has more operational configurations compared to the circuit configuration of FIG. 18A.

Figure 18C:
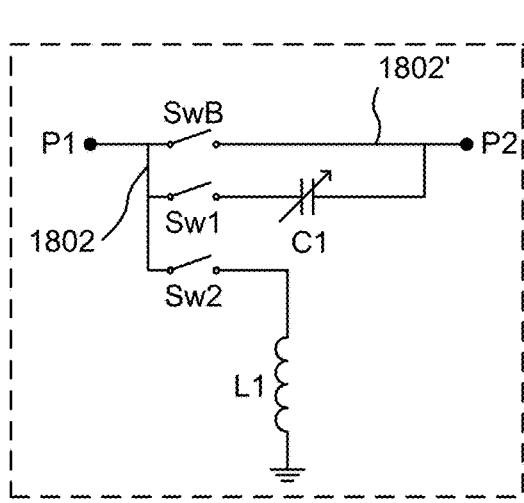

In FIG. 18C, in an active non-bypass mode, switch Sw1 may be closed to connect a signal path 1802 to a series-connected tunable capacitor C1. Independently, switch SwB and switch Sw2 may be closed to couple a shunt-connected inductor L1 to the signal paths 1802 and 1802' (which is part of the signal path from port P1 to port P2 through switch SwB, in this configuration). Alternatively, if switch Sw1 is closed, then the inductor L1 may be coupled to the signal path 1802 by closing just switch Sw2, leaving switch SwB open. Thus, in different operational configurations, capacitor C1, or inductor L1, or the combination of capacitor C1 and inductor L1, may be coupled to the signal path 1802 (and 1802', in the case of the inductor L1 alone). The circuit configuration of FIG. 18C thus has even more operational configuration modes compared to the circuit configuration of FIG. 18A.

Figure 18D:
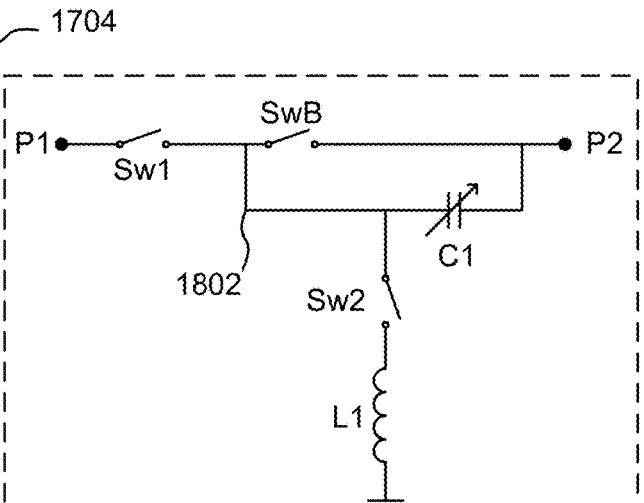

In FIG. 18D, switch Sw1 serves as an isolation switch, entirely decoupling the filter tuning circuit and the bypass switch SwB from port P1. Port P1 thus is effectively coupled only to the OFF capacitance, $C_{OFF}$, of one switch (Sw1) rather than of two or more switches (SwB, Sw1, Sw2) as in the circuits of FIGS. 18A-18C, which reduces the capacitive loading seen by the antenna, thus improving circuit performance (e.g., insertion loss, return loss). In an active non-bypass, non-isolation mode, switch Sw1 is closed and the circuit is otherwise similar to the circuit of FIG. 18B.

Figure 18E:
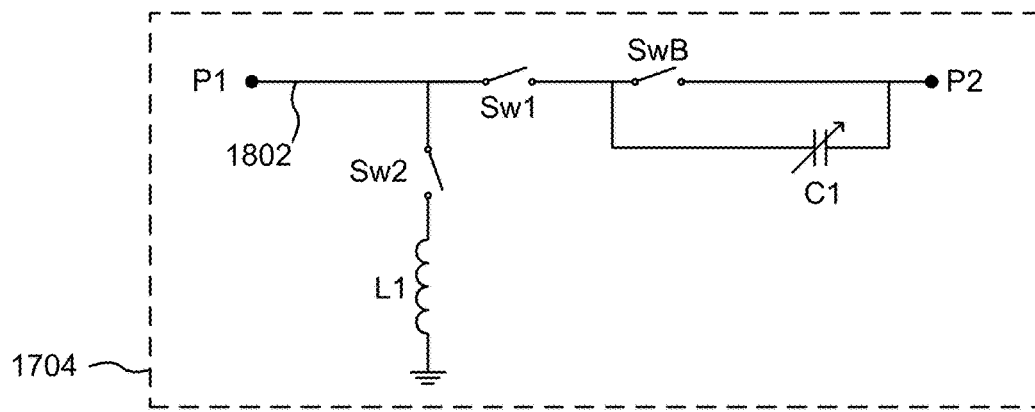

In FIG. 18E, in an active non-bypass mode, switch Sw1 may be closed to connect a signal path 1802 to a series-connected tunable capacitor C1. In addition, an inductor L1 may be coupled to the signal path 1802 via switch Sw2. The circuit configuration of FIG. 18E thus has more operational configurations compared to the circuit configuration of FIG. 18A.

As should be clear, other filter tuning block 1704 configurations may be used to accomplish the same function—beneficially altering the out-of-band input impedance of connected lower frequency band filters (and passive filter structures, in the case of diplexed band filter pairs) to reduce the load on a higher-frequency band filter. Further, FIGS. 18A-18E show circuits that can help move a capacitive impedance closer to an "open". Depending on filter construction and if out-of-band impedances of concern are above or below a desired passband, the impedances of concern could also be inductive. As would be known by one of ordinary skill in the art, tuner circuits for inductive impedances would require a different topology of inductors and capacitors than those shown in FIGS. 18A-18E. In general, the concept of using switches to remove passive elements, the use of tunable passive elements, and various forms of a bypass switch are part of this invention.

Since the common port impedance depends not only on factors that are constant (e.g., connecting conductors and transmission lines), but also on variable operational factors (e.g., CA combinations), it is useful for embodiments of the filter tuning block 1704 to be tunable. For a particular IC embodiment, a lookup table with appropriate tuning settings (e.g., for a DTC used for the tunable capacitor C1) may be used to select pre-determined values for particular operational configurations. Particular values for C1 and L1 may be selected by modeling or design iteration, taking into account desired CA combinations, operational frequency of associated band filter or filters, IC circuit characteristics (e.g., parasitic impedances and reactances of other circuits and circuit elements, such as connecting conductors and transmission lines, FETs, ground and power planes, etc.), and module routing parasitics.

Figure 19:
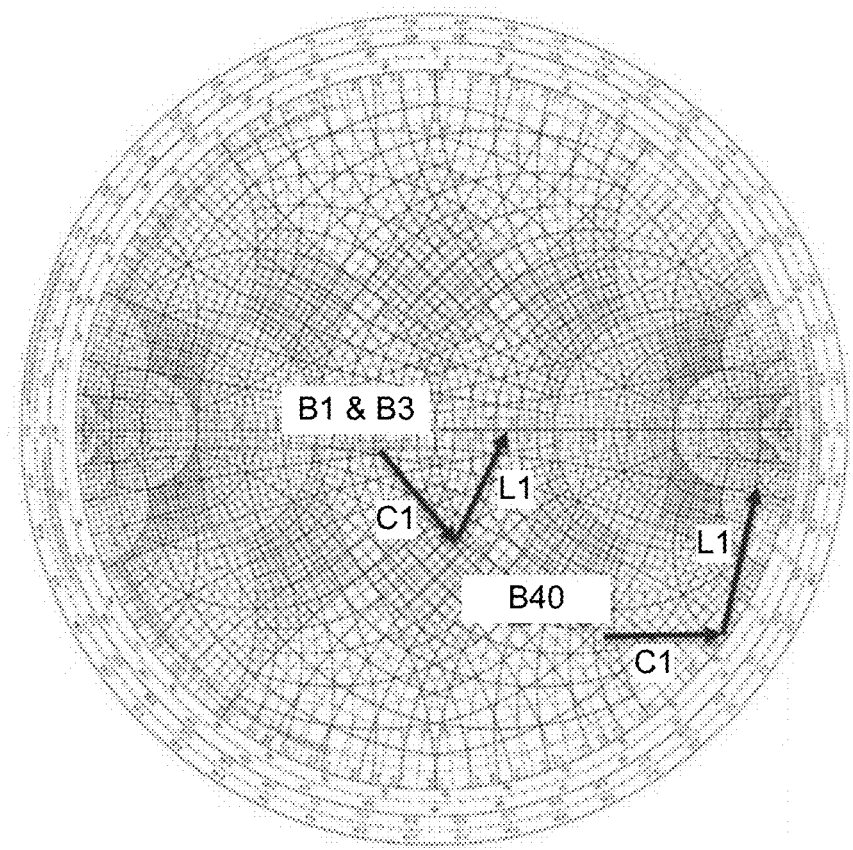
FIG. 19 is a Smith chart showing beneficial effects on band filter B40 of coupling a filter tuning block to the band filter pair B1 and B3 for a CA mode combining B1, B3, and B40.

FIG. 19 is a Smith chart 1900 showing beneficial effects on band filter B40 of coupling a filter tuning block 1704 to the band filter pair B1 and B3 for a CA mode combining B1, B3, and B40. The filter tuning block 1704 may be the same as, or similar to, the embodiment of FIG. 18A. With suitable values for C1 and L1 (the effects of each being shown as separate vectors), the impedance plot point for B40 is rotated towards closer to an "open" on the Smith chart 1900.

Figure 20:
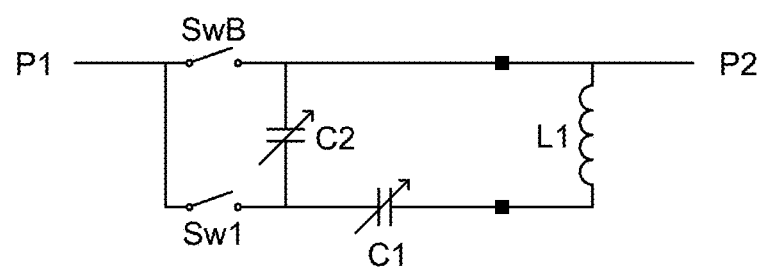
FIG. 20 is a schematic diagram of one example of a resonant network circuit that may be used in a filter tuning block.

In alternative embodiments, one or more of the filter tuning blocks 1704 may use a different operational principal: rather than change the phase of a lower frequency band filter, a resonant network circuit configuration may be designed to directly pass the lower frequency band while blocking the higher frequency band. For example, FIG. 20 is a schematic diagram of one example of a resonant network circuit 2000 that may be used in a filter tuning block 1704. In the illustrated example, a bypass switch SwB, when closed (alone or in combination with additional series-connected switches), directly couples a first port P1 to a second port P2, thus allowing the associated filter tuning circuit to be bypassed if desired (e.g., for a non-CA mode). A series switch Sw1 couples port P1 to port P2 through a series-connected capacitor C1 and inductor L1; a second capacitor C2 is connected between port P1 and port P2 in parallel with C1 and L1. The capacitors C1, C2 and inductor L1 form a resonant network. As an example, port P1 may be coupled to an antenna (similar to the common port of the multi-path switch 1706 in FIG. 17), and port P2 may be coupled to the input of a B1/B3 diplexed band filter pair.

The inductor L1 and/or the capacitors C1, C2 may be tunable; in the illustrated examples, the capacitors C1, C2 are both shown as tunable. In particular embodiments, one or both of the capacitors C1, C2 may be a digitally tunable or switchable capacitor (DTC), and the inductor L1 may be a digitally tunable or switchable inductor (DTL) and/or a digitally tunable or selectable transmission line element (TLEs), such as a microstrip or co-planar waveguide or a lumped-element transmission line circuit. The inductor L1 and/or the capacitors C1, C2—and particularly the inductor L1—may be internal or external to an IC embodiment.

Figure 21:
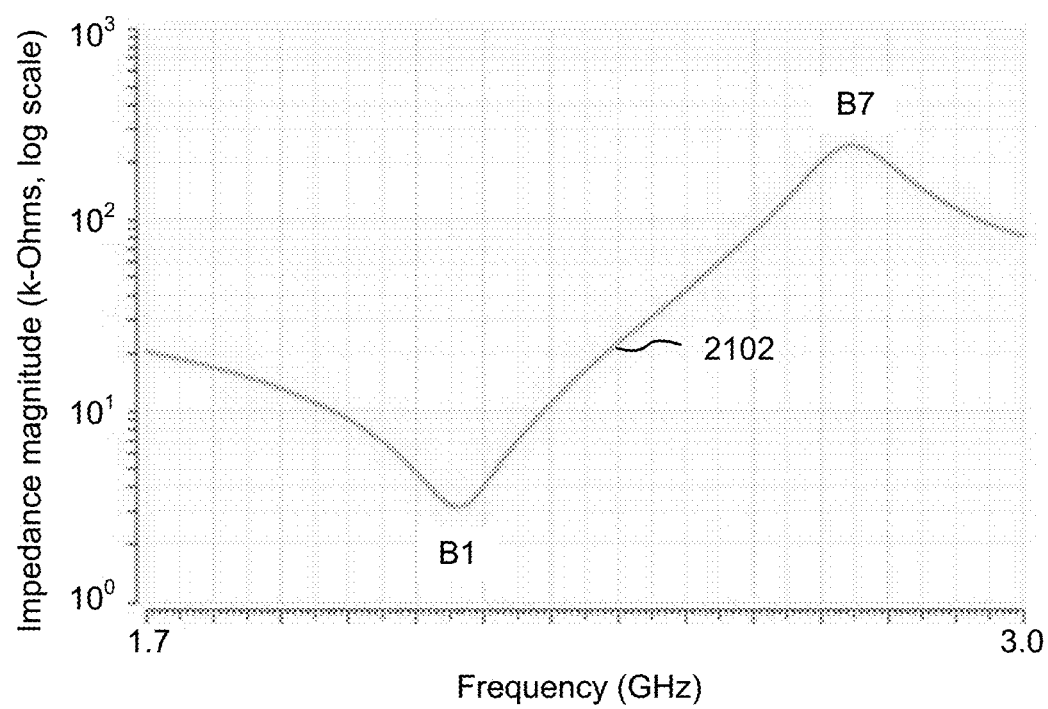
FIG. 21 is a graph of impedance magnitude of a resonant network for a CA case of B1/B3/B7 (k-Ohms, log scale) versus frequency (GHz).

The series-connected capacitor C1 and inductor L1 network, with suitably selected values, functions as a series tank circuit that resonates to a low impedance at lower frequencies (e.g., the frequencies of bands B1 and B3), which results in relatively low insertion loss for those band filters. Notably, the series network becomes inductive beyond the selected low frequency, and the parallel capacitor C2 anti-resonates with that residual inductance at higher frequencies (e.g., the B7 frequency band) to create a high impedance at that higher frequency. For example, FIG. 21 is a graph of impedance magnitude of a resonant network for a CA case of B1/B3/B7 (k-Ohms, log scale) versus frequency (GHz). As graph line 2102 indicates (and keeping in mind the log scale of impedance magnitudes in the graph 2100), the impedance of the resonant network in the frequency band for B1 at about 2.15 GHz is very low compared to the impedance of the frequency band for B7 at about 2.7 GHz (the graph would be similar for bands B3 and B7).

Figure 22A:
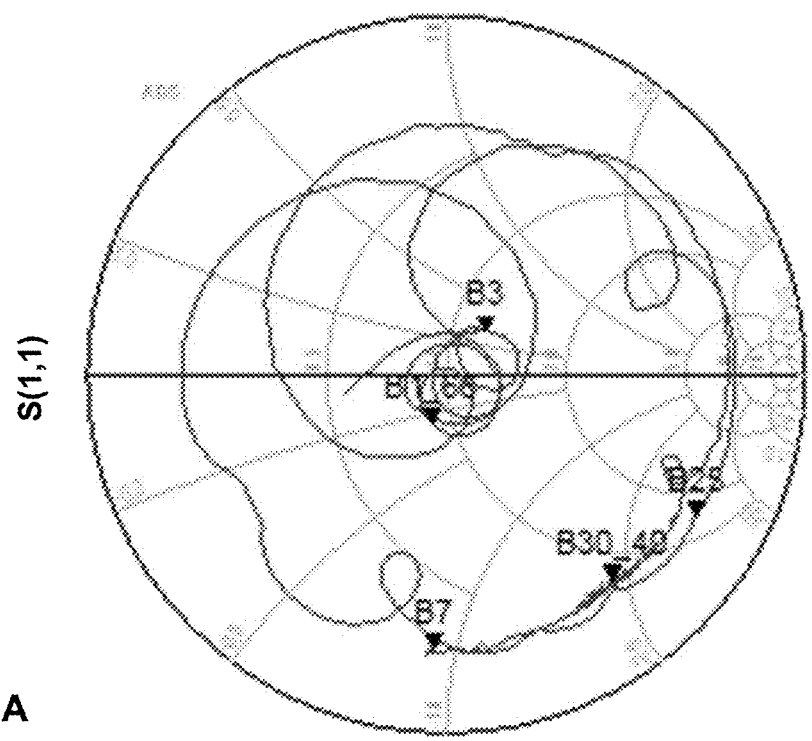
FIG. 22A is a Smith chart graphing the S11 parameters for modeled embodiments of diplexed band filters B1 and B3, illustrating the loading effect of the lower frequency band filters at the higher frequency bands, similar to the Smith chart of FIG. 16.
Figure 22B:
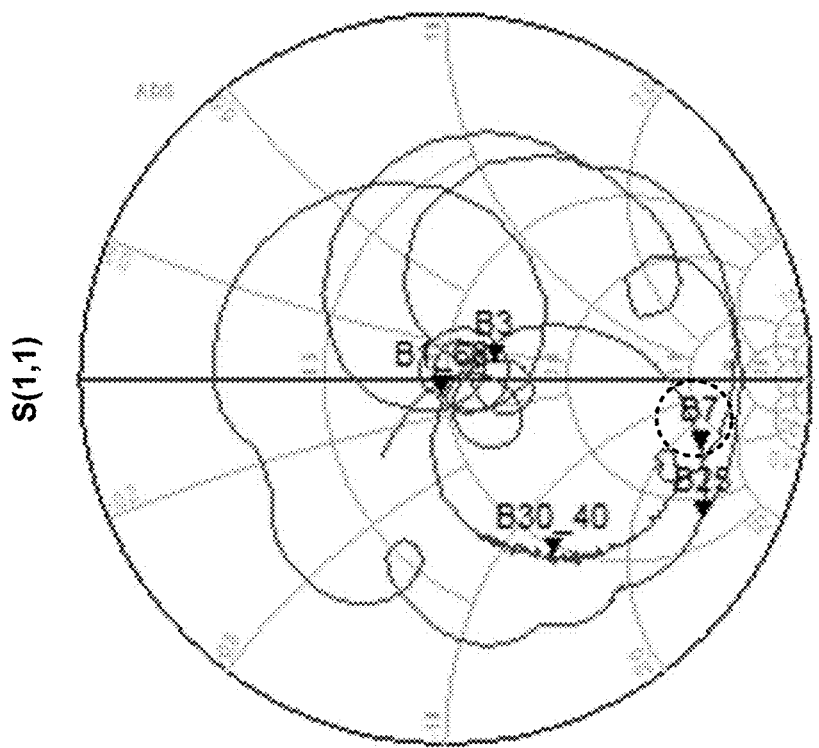
FIG. 22B is a Smith chart graphing the S11 parameters for modeled embodiments of diplexed band filters B1 and B3, illustrating the beneficial effect at the B7 band of utilizing a resonant network circuit of the type shown in FIG. 20 as a filter tuning block for the diplexed band filter pair B1 and B3 in a CA case of B1/B3/B7.

The overall effect of using a resonant network circuit in a filter tuning block 1704 is similar to using the filter tuning circuits shown in FIGS. 18A-18E. FIG. 22A is a Smith chart 2200 graphing the S11 parameters for modeled embodiments of diplexed band filters B1 and B3, illustrating the loading effect of the lower frequency band filters at the higher frequency bands, similar to the Smith chart of FIG. 16. FIG. 22B is a Smith chart 2202 graphing the S11 parameters for modeled embodiments of diplexed band filters B1 and B3, illustrating the beneficial effect at the B7 band (see dotted-line circle) of utilizing a resonant network circuit of the type shown in FIG. 20 as a filter tuning block 1704 for the diplexed band filter pair B1 and B3 in a CA case of B1/B3/B7. More specifically, the impedance of the B1/B3 diplexed filter pair at the B7 band is rotated closer to an "open" characteristic on the Smith chart 2202 of FIG. 22B, and thus will present less loading to the B7 filter, resulting in improved B7 performance.

As should be clear, one or more filter tuning blocks 1704 may be configured with phase shift circuitry, while one or more tuning blocks 1704 may be configured with resonant network circuitry.

An additional benefit of certain embodiments of the invention results from the realization that some sets of band filters are independent of each other—that is, the band filters in such sets are mutually exclusive, and thus never used together in a CA case. This characteristic can be advantageously used to reduce the size of a pair of filter tuning blocks by sharing components (such as one or more inductors or capacitors) between two or more filter tuning circuits.

Figure 23:
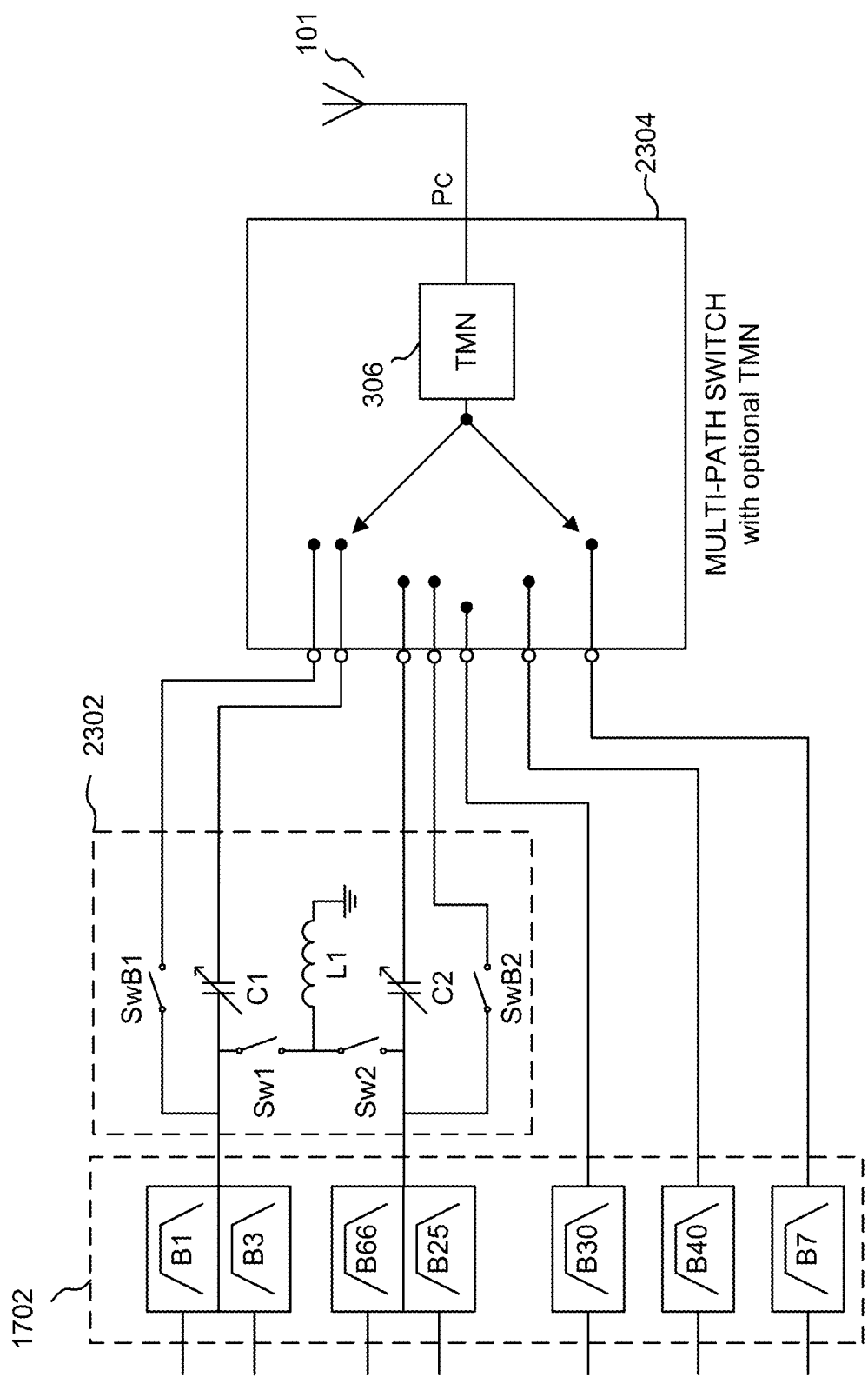
FIG. 23 is a block diagram of a direct mapped RF signal switching and filter circuit that includes a bank of band filters and a shared filter tuning block.

For example, FIG. 23 is a block diagram of a direct mapped RF signal switching and filter circuit 2300 that includes a bank 1702 of band filters and a shared filter tuning block 2302. The illustrated shared filter tuning block 2302 includes a first capacitor C1 coupled between a port of a multi-path switch 2304 (which may include a TMN 306 on the common port Pc) and a first diplexed band filter pair B1/B3, and a second capacitor C2 coupled between another port of the multi-path switch 2304 and a second diplexed band filter pair B66/B25. A shared shunt inductor L1 may be selectively (but mutually exclusively) connected to capacitor C1 or to capacitor C2 by respective switches Sw1, Sw2. In a non-bypassed mode, when Sw1 is closed and Sw2 is opened, capacitor C1 and inductor L1 operate as a filter tuning circuit for band filter pair B1/B3. Conversely, in a non-bypassed mode, when Sw2 is closed and Sw1 is opened, capacitor C2 and inductor L1 operate as a filter tuning circuit for band filter pair B66/B25.

The configuration illustrated in FIG. 23 enables 5 common CA cases (however, more than 5 cases are possible), each comprising three band filters (some pairs of which may be diplexed, indicated by parentheses), as shown in TABLE 3. Note that the illustrated architecture also supports a four-band CA case, (B1+B3)+B7+B40.

TABLE 3

| Case # | Band Filter CA Combinations |
|---|---|
| 1 | (B1 + B3) + B7 |
| 2 | (B1 + B3) + B40 |
| 3 | B3 + B40 + B7 |
| 4 | (B66 + B25) + B7 |
| 5 | (B66 + B25) + B30 |

In this example, filter bands B1 and B3 are only used in cases 1, 2, and 3 (filter band B3 only), and filter bands B66 and B25 are only used in cases 4 and 5. Consequently, those filter band pairs are never used at the same time, and the inductor L1 may be shared between the filter band pairs for the different cases without concurrent usage. In RF circuits, inductors may be relatively large, and often external to an IC containing related circuitry. Even if implemented as an internal integrated component of an IC, significant IC die area is often required for inductors. Accordingly, the configuration shown in FIG. 23 allows a reduction in component count (only one inductor, rather than two) and thus requires fewer external connections (for an external inductor) or less IC die area (for an internal inductor). In addition, the ability to turn OFF an attached amplifier (e.g., an LNA) to one band filter of a diplexed pair and/or to filter out one band filter of a diplexed pair (e.g., B1 of the B1/B3 pair) allows the remaining band filter (e.g., B3) to be used by itself or in combination with other band filters (e.g., B7), resulting in lower loss compared to the diplexed combination and allowing a single band filter of a diplexed pair.

In the shared filter tuning block 2302, an optional bypass switch SwB1 is coupled between the diplexed band filter pair B1/B3 and a separate port of the multi-path switch 2304. Similarly, an optional bypass switch SwB2 is coupled between the diplexed band filter pair B66/B25 and a separate port of the multi-path switch 2304. Again, the optional bypass switches SwB1, SwB2 allow the associated filter tuning circuit to be bypassed when operating in a non-CA mode, and improve isolation. An advantage of utilizing different ports for the bypass switches SwB1, SwB2 is that no additional series switches are needed for the signal paths that include capacitors C1 or C2, resulting in lower insertion loss.

Figures 24A, 24B:
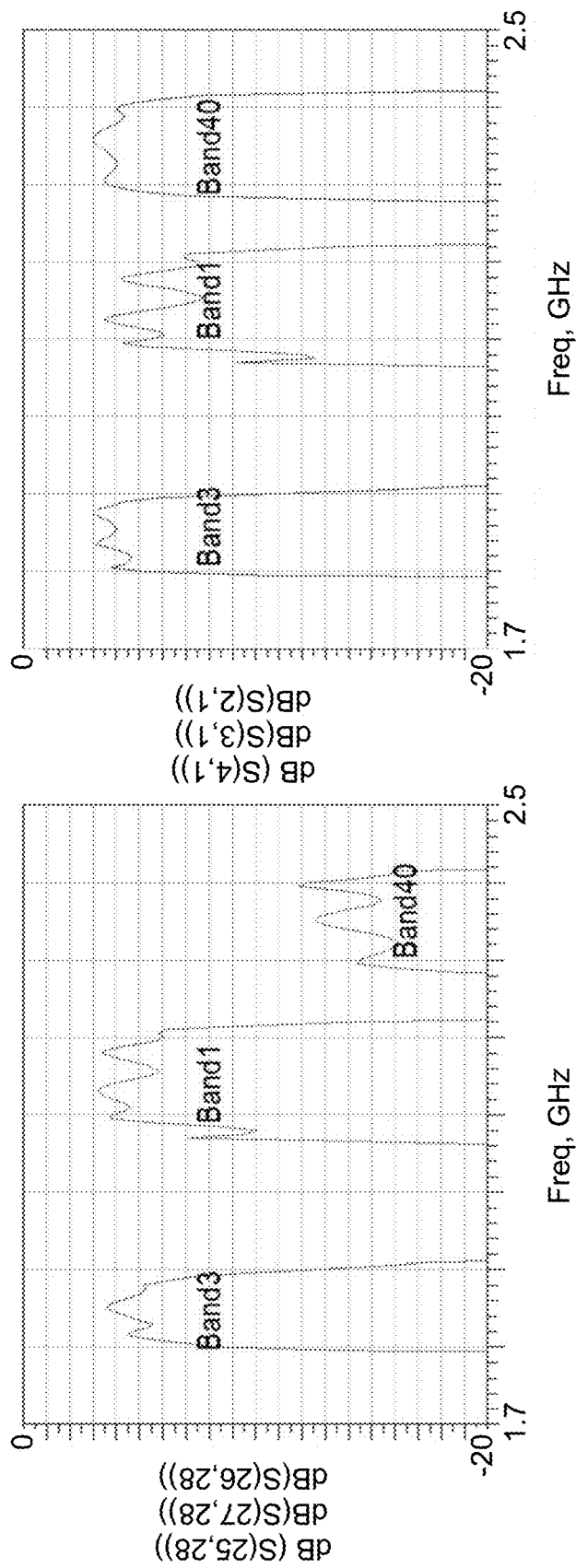
FIG. 24A is a graph of insertion loss versus frequency for a B1/B3/B40 CA case for a modeled direct mapped adaptive tuning network lacking filter tuning blocks.
FIG. 24B is a graph of insertion loss versus frequency for a B1/B3/B40 CA case for a modeled direct mapped adaptive tuning network with filter tuning blocks for the B1/B3 band filters in a diplexer configuration.

Benefits of CA direct mapped adaptive tuning networks with filter tuning blocks on selected lower frequency bands include: improved overall non-CA performance; improved high band performance in CA cases (e.g., band B40 in a B1/B3/B40 CA case); reduced component count and less circuit complexity; and a more versatile control scheme that is better suited for adaptive tuning optimization. As a further example of such benefits, FIG. 24A is a graph 2400 of insertion loss versus frequency for a B1/B3/B40 CA case for a modeled direct mapped adaptive tuning network lacking filter tuning blocks, while FIG. 24B is a graph 2420 of insertion loss versus frequency for a B1/B3/B40 CA case for a modeled direct mapped adaptive tuning network with filter tuning blocks for the B1/B3 band filters in a diplexer configuration. As can be seen by comparing FIG. 24A to FIG. 24B, without tuning, the performance of the B40 band filter circuitry is significantly degraded. By proper tuning with a filter tuning block for the B1/B3 band filters, the B40 band filter circuitry performance degradation is essentially eliminated.

Figure 25:
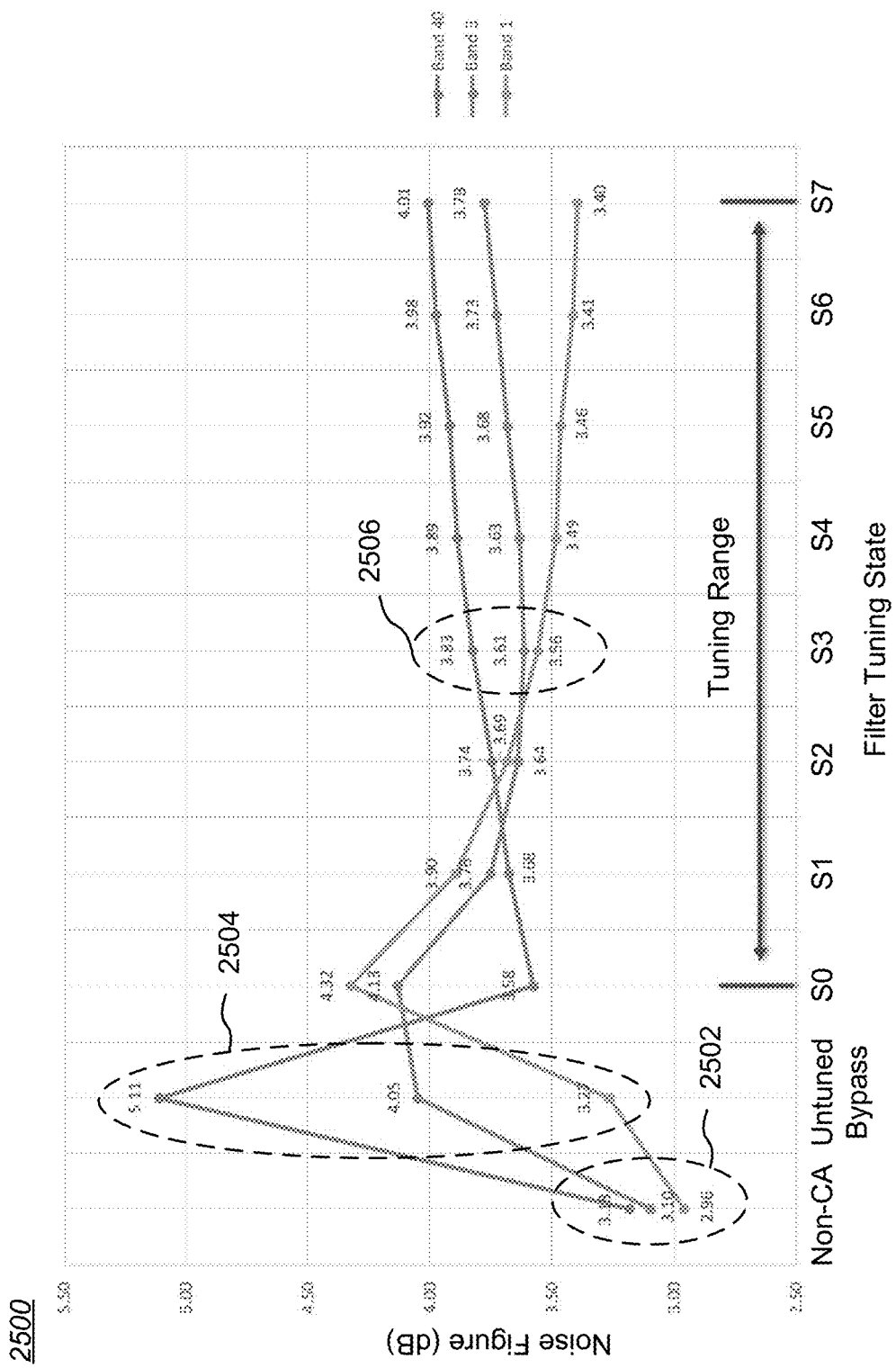
FIG. 25 is a graph of Noise Figure versus circuit state for band filters B1, B3, and B40 in a modeled direct mapped adaptive tuning network with bypassable filter tuning blocks for the B1/B3 band filters in a diplexer configuration.

As yet another example of the benefits of CA direct mapped networks with filter tuning blocks on selected lower frequency bands, FIG. 25 is a graph 2500 of Noise Figure versus circuit state for band filters B1, B3, and B40 in a modeled direct mapped adaptive tuning network with bypassable filter tuning blocks for the B1/B3 band filters in a diplexer configuration. For the various circuit states, better performance is achieved when all three bands have a minimum difference compared to non-CA operation (note that larger values for Noise Figure are worse). In a non-CA mode 2502, there is no loading of band filter B40 by band filters B1 or B3, since the bands are not aggregated; hence, the sensitivity is approximately the same for each band. In an "untuned" CA mode 2504 in which the filter tuning blocks for the B1/B3 band filters are purposely bypassed (not a normal operating condition), band filter B40 is significantly affected by band filters B1 and B3, resulting in poor sensitivity for band filter B40. In contrast, in a CA mode in which the filter tuning blocks for the B1/B3 band filters are tuned across a range of values (e.g., by setting a DTC capacitor component to different capacitance values), a range of sensitivity values for all three band filters can be achieved that are much closer to their non-CA values than the untuned CA mode 2504. Different tuning states present different tradeoffs between the performance of the three bands. Any one of the tuning states S0-S7 may be selected for a particular application; for example, in one modeled application, the tuning state S3 resulted in a set of sensitivity values 2506 for all three band filters that met operational specifications.

The noted benefits are realized for CA direct mapped adaptive tuning networks with filter tuning blocks by targeting specific bands for filter tuning instead of all bands, depending on particular performance requirements and filter characteristics (e.g., such as applying filter tuning to band filters for the lower frequency B1 and B3 bands, but not for the higher frequency B7 band).

One way of describing such embodiments is that they encompass a carrier aggregation (CA) multi-path radio-frequency (RF) adaptive tuning network switch architecture, including: a multi-path switch having a plurality of signal ports and a common port, the multi-path switch configured to concurrently connect at least two selected signal ports to the common port in at least one CA mode of operation; a plurality of band filters, each corresponding to an associated RF frequency band in a range of low frequencies to high frequencies; and at least one filter tuning block coupled between an associated signal port of the multi-path switch and at last one associated band filter, each filter tuning block configured to adjust the RF characteristics of its associated band filter with respect to at least one other band filter when operating in at least one CA mode of operation so as to suppress a capacitive loading effect for at least one other band filter; wherein fewer than all of the plurality of band filters are coupled to an associated filter tuning block. In some embodiments, at least one filter tuning block coupled between an associated signal port of the multi-path switch and at last one associated band filter is associated with a low RF frequency band, and the at least one other band filter is associated with a high RF frequency band.

Another way of describing such embodiments is that they encompass a carrier aggregation (CA) direct mapped radio-frequency (RF) adaptive tuning network switch architecture, including: a multi-path switch having a plurality of signal ports and a common port, the multi-path switch configured to concurrently connect at least two selected signal ports to the common port in at least one CA mode of operation; a first set of band filters for a first range of RF frequencies, each member of the set being coupled to a respective signal port of the multi-path switch; and a second set of band filters for a second range of RF frequencies, each member of the set being coupled to a respective signal port of the multi-path switch through an associated filter tuning block; wherein each filter tuning block adjusts the RF characteristics of the associated band filter with respect to at least one band filter in the first set of band filters when operating in at least one CA mode of operation, so as to suppress a capacitive loading effect for at least one band filter in the second set of band filters. In some embodiments, the first range of RF frequencies are high frequencies, and the second range of RF frequencies are low frequencies.

Figure 26:
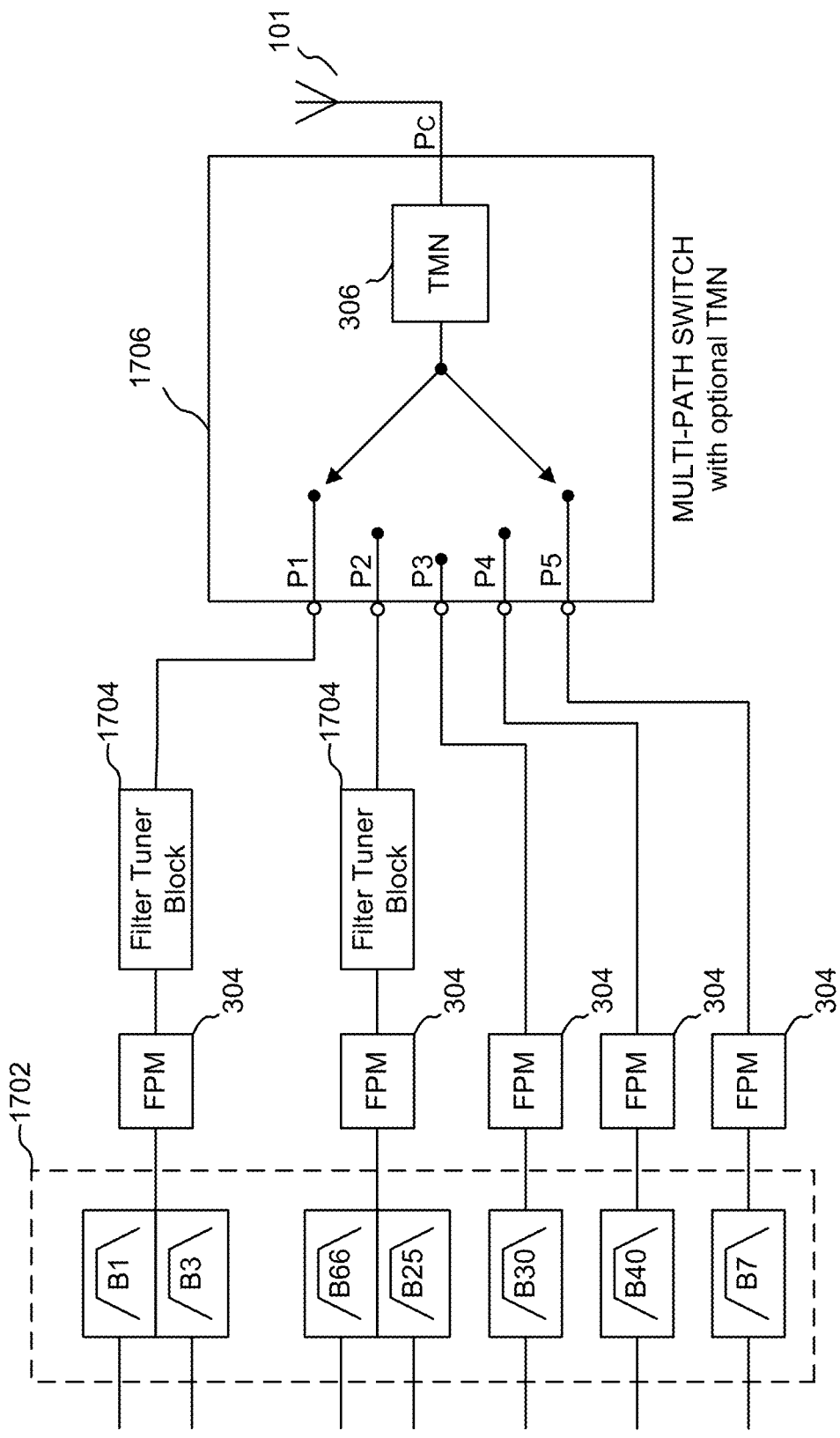
FIG. 26 is a block diagram of another embodiment of a direct mapped RF signal switching and filter circuit suitable for use in a CA radio system as well as in other applications.

Elements of the embodiments described above with respect to FIGS. 3-14 may be used in conjunction with embodiments that include filter tuning blocks. For example, FIG. 26 is a block diagram of another embodiment of a direct mapped RF signal switching and filter circuit 2600 suitable for use in a CA radio system as well as in other applications. The illustrated embodiment includes a bank of band filters 1702, one or more filter tuning blocks 1704, a multi-path switch 1706 that may include a tunable matching network (TMN) network 306 on the common port Pc, and, optionally, a bank of filter pre-match (FPM) networks 304 selectively couplable (directly, or indirectly through a filter tuning block 1704) to an associated signal port of the multi-path switch 1706. Optionally, some or all signal ports Pn of the multi-path switch 1706 may include an associated digitally-controlled TMN (not shown) to further improve impedance matching. In general, a filter tuning block 1704 and an FPM network 304 may be in any series order with respect to each other, so long as the FPM network 304 is between an associated band filter and the common port of the multi-path switch 1706.

Methods

Another aspect of the invention includes methods of adaptively tuning a carrier aggregation (CA) multi-path radio-frequency (RF) switch architecture. For example, FIG. 27 is a process flow diagram of a first method of adaptively tuning a CA multi-path RF switch architecture, including: providing a multi-path switch having a plurality of signal ports and a common port, the multi-path switch configured to concurrently connect at least two selected signal ports to the common port in at least one CA mode of operation (Block 2702); providing a plurality of band filters, each corresponding to an associated RF frequency band in a range of low frequencies to high frequencies (Block 2704); and coupling at least one filter tuning block between an associated signal port of the multi-path switch and at last one associated band filter, each filter tuning block configured to adjust the RF characteristics of its associated band filter with respect to at least one other band filter when operating in at least one CA mode of operation so as to suppress a capacitive loading effect for at least one other band filter (Block 2706); wherein fewer than all of the plurality of band filters are coupled to an associated filter tuning block (Block 2708).

As another example, FIG. 28 is a process flow diagram of a second method of adaptively tuning a CA multi-path RF switch architecture, including: providing a multi-path switch having a plurality of signal ports and a common port, the multi-path switch configured to concurrently connect at least two selected signal ports to the common port in at least one CA mode of operation (Block 2802); providing a first set of band filters for a first range of RF frequencies, and coupling each member of the set being to a respective signal port of the multi-path switch (Block 2804); providing a second set of band filters for a second range of RF frequencies, and coupling each member of the set coupled to a respective signal port of the multi-path switch through an associated filter tuning block (Block 2806); and using the filter tuning blocks to adjust the RF characteristics of the associated band filter with respect to at least one band filter in the first set of band filters when operating in at least one CA mode of operation, so as to suppress a capacitive loading effect for at least one band filter in the second set of band filters (Block 2808).

The above methods may also include one or more of the following: wherein at least one filter tuning block includes a phase adjustment circuit; wherein the phase adjustment circuit includes a digitally tunable capacitor configured to tune the filter tuning block; wherein at least one filter tuning block includes a resonant network circuit that has a low impedance at low frequencies and a higher impedance at high frequencies; wherein at least one filter tuning block includes a bypass switch for selectively operating the at least one filter tuning block in a non-CA mode of operation; wherein at least one filter tuning block includes at least one switched passive component for adjusting the RF characteristics of an applied signal; wherein at least one pair of the plurality of band filters are passively combined in a diplexed configuration; wherein at least one filter tuning block is coupled to two of the plurality of band filters passively combined in a diplexed configuration; further including at least two filter tuning blocks, wherein a first filter tuning block shares a shunt inductor with a second filter tuning block, and the shunt inductor is selectively but mutually exclusively connected to the first filter tuning block or to the second filter tuning block; wherein the multi-path switch and a tuning component of the at least one filter tuning block are integrated on the same integrated circuit die; wherein the multi-path switch includes a digitally-controlled tunable matching network coupled to the common port of the multi-path switch and selectively controlled to counteract impedance mismatch conditions arising from coupling more than one selected signal port concurrently to the common port; and/or further including at least one filter pre-match network selectively couplable to an associated signal port of the multi-path switch.

Configuration and Control

The elements that can be connected to the TMN networks 306, FPM networks 304, PM networks 1102, and filter tuning blocks 1704, 2302 are not limited to the impedance tuning elements described above (e.g., transmission line elements, fixed and adjustable capacitors, and fixed and adjustable inductors). Other elements may be connected for other applications. For example, an antenna bus can be connected to a multi-path switch such that it may be used for aperture tuning.

Values for the tuning elements in (e.g., fixed inductors or DTLs, fixed capacitors or DTCs, transmission line elements, and phase shifters) are selected to optimize particular application requirements, balancing impedance coverage, bandwidth, insertion loss, transducer gain, and other limitations such as die size. The set of available impedance values may be optimized based on sub-band or RF channel information for even more optimized performance.

Each FET switch in the illustrated examples includes an associated control line (not shown) that enables setting the switch to an ON (or CLOSED) conductive state or to an OFF (or OPEN) non-conductive or blocking state, and thus behaves as a single-pole, single-throw switch. Further, stacks of FET switches may be controlled by a common control line signal so as to switch ON or OFF concurrently, and thus the stack behaves like a single switch. Each control line would be coupled to other circuitry (not shown in all cases), which may be internal or external. For example, control signals may be provided to the switch control lines through the well-known interfaces specified by the MIPI (Mobile Industry Processor Interface) Alliance, or through the well-known Serial Peripheral Interface (SPI) bus, or by direct control signal pins, or by any other convenient means. Applied control signals may be directly coupled to associated FET switches, or be processed through combinatorial logic circuitry or a mapping circuit (e.g., a lookup table) before being coupled to associated FET switches. In addition, the gate of each FET may be coupled to a driver circuit that converts a logic signal (1, 0) to a suitable drive voltage (e.g., +3V, −3V).

Examples of FET stacking are shown in U.S. Pat. No. 7,248,120, issued Jul. 24, 2007, entitled "Stacked Transistor Method and Apparatus"; U.S. Pat. No. 7,008,971, issued Aug. 8, 2006, entitled "Integrated RF Front End"; and U.S. Pat. No. 8,649,754, issued Feb. 11, 2014, entitled "Integrated RF Front End with Stacked Transistor Switch", and assigned to the assignee of the present invention, all of which are hereby incorporated by reference.

Each RF signal switching and filter circuit in accordance with the present invention may be tested and characterized by conventional testing means and packaged in a manner suitable for RF circuits, either alone or as part of a larger circuit or system.

Uses

RF signal switching and filter circuits in accordance with the present invention are useful in a wide variety of applications, including radar systems (including phased array and automotive radar systems) and radio systems. Radio system usage includes (again, without limitation) cellular radios systems (including base stations, relay stations, and handheld transceivers) that use such standards as Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

Fabrication Technologies and Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly SOI FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

In order to improve linearity and other performance characteristics, particularly when using an SOI-based fabrication process (including SOS), it may be especially useful to structure and fabricate FETs in accordance with the teachings of U.S. Pat. No. 7,910,993, issued Mar. 22, 2011, entitled "Method and Apparatus for use in Improving Linearity of MOSFETs using an Accumulated Charge Sink"; and U.S. Pat. No. 8,742,502, issued Jun. 3, 2014, entitled "Method and Apparatus for use in Improving Linearity of MOSFETs Using an Accumulated Charge Sink", and assigned to the assignee of the present invention, both of which are hereby incorporated by reference A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A multi-path radio-frequency (RF) adaptive tuning network switch architecture configurable to operate in a carrier aggregation mode and in a non-carrier aggregation mode, including:
   (a) a multi-path tunable switch having (1) a plurality of signal ports each configured to be coupled to a corresponding RF band filter and (2) a common port, the multi-path tunable switch configured to concurrently connect at least two selected signal ports to the common port in at least one mode of operation;
   (b) a single digitally-controlled tunable matching network coupled to the common port of the multi-path tunable switch and selectively controlled to counteract impedance mismatch conditions arising from coupling more than one selected RF band filter concurrently to the common port; and
   (c) at least one digitally-controlled filter pre-match network configured to have matching elements selectively coupled to or uncoupled from a corresponding signal port of the multi-path tunable switch, wherein the at least one digitally-controlled filter pre-match network is uncoupled from the corresponding signal port when operating in a non-carrier aggregation mode.

2. The multi-path radio-frequency (RF) adaptive tuning network switch architecture of claim 1, wherein the multi-path tunable switch and the single digitally-controlled tunable matching network are integrated on the same integrated circuit die.

3. The multi-path radio-frequency (RF) adaptive tuning network switch architecture of claim 1, wherein the multi-path tunable switch and the at least one digitally-controlled filter pre-match network are integrated on the same integrated circuit die.

4. The multi-path radio-frequency (RF) adaptive tuning network switch architecture of claim 1, wherein the digitally-controlled tunable matching network includes at least one of a digitally tunable capacitor and/or a digitally tunable inductor.

5. The multi-path radio-frequency (RF) adaptive tuning network switch architecture of claim 1, wherein the digitally-controlled tunable matching network is reconfigurable between at least two types of topologies.

6. The multi-path radio-frequency (RF) adaptive tuning network switch architecture of claim 1, wherein at least one signal port of the multi-path tunable switch includes a corresponding signal port-side digitally-controlled tunable matching network.

7. The multi-path radio-frequency (RF) adaptive tuning network switch architecture of claim 1, wherein at least one of the at least one digitally-controlled filter pre-match network includes a signal path between an input port and an output port, a switch coupled to signal path, and at least one impedance tuning element coupled to the switch and configured to be coupled to circuit ground.

8. The multi-path radio-frequency (RF) adaptive tuning network switch architecture of claim 7, wherein at least one of the at least one impedance tuning element includes a digitally adjustable impedance tuning element.

9. The multi-path radio-frequency (RF) adaptive tuning network switch architecture of claim 1, further including at least one band filter coupled to one of the at least one digitally-controlled filter pre-match network.

* * * * *